(12) United States Patent
Watanabe et al.

(10) Patent No.: US 12,707,635 B2
(45) Date of Patent: Aug. 11, 2026

(54) SEMICONDUCTOR MEMORY DEVICE

(71) Applicant: KIOXIA CORPORATION, Tokyo (JP)

(72) Inventors: Shigehiro Watanabe, Yokkaichi Mie (JP); Kojiro Shimizu, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 937 days.

(21) Appl. No.: 17/883,410

(22) Filed: Aug. 8, 2022

(65) Prior Publication Data

US 2023/0284447 A1 Sep. 7, 2023

(30) Foreign Application Priority Data

Mar. 7, 2022 (JP) ................................ 2022-034638

(51) Int. Cl.

| | |
|---|---|
| ***H01L 27/11582*** | (2017.01) |
| ***H10B 41/27*** | (2023.01) |
| ***H10B 41/40*** | (2023.01) |
| ***H10B 43/27*** | (2023.01) |
| ***H10B 43/40*** | (2023.01) |

(52) U.S. Cl.

CPC ............ *H10B 43/27* (2023.02); *H10B 41/27* (2023.02); *H10B 41/40* (2023.02); *H10B 43/40* (2023.02)

(58) Field of Classification Search

None

See application file for complete search history.

(56) References Cited

U.S. PATENT DOCUMENTS

| | | | | |
|---|---|---|---|---|
| 2018/0261529 A1 | 9/2018 | Yoshimizu et al. | | |
| 2020/0251484 A1* | 8/2020 | Ito | .......................... | H10B 43/30 |
| 2021/0066338 A1* | 3/2021 | Otaguro | ................. | H10B 43/10 |
| 2025/0294751 A1* | 9/2025 | Shimomura | ........... | H10B 43/10 |

FOREIGN PATENT DOCUMENTS

| | | |
|---|---|---|
| JP | 2018152412 A | 9/2018 |
| JP | 2020126938 A | 8/2020 |
| JP | 2021034651 A | 3/2021 |

* cited by examiner

*Primary Examiner* — Long Pham

(74) *Attorney, Agent, or Firm* — Kim & Stewart LLP

(57) ABSTRACT

According to one embodiment, a semiconductor memory device includes a stacked body with first conductive layers and first insulating layers alternately stacked. The stacked body includes a staircase portion in which the first conductive layers are in a staircase shape. A columnar portion extends in a stacking direction through the stacked body at the staircase portion. The columnar portion includes a semiconductor layer, a second insulating layer covering a side wall of the semiconductor layer, and a third insulating layer that covers the second insulating layer. The third insulating layer includes a material different from the second insulating layer and includes flanged portions that protrude from a sidewall thereof toward the first conductive layers at corresponding height positions.

20 Claims, 14 Drawing Sheets

FIG. 2A
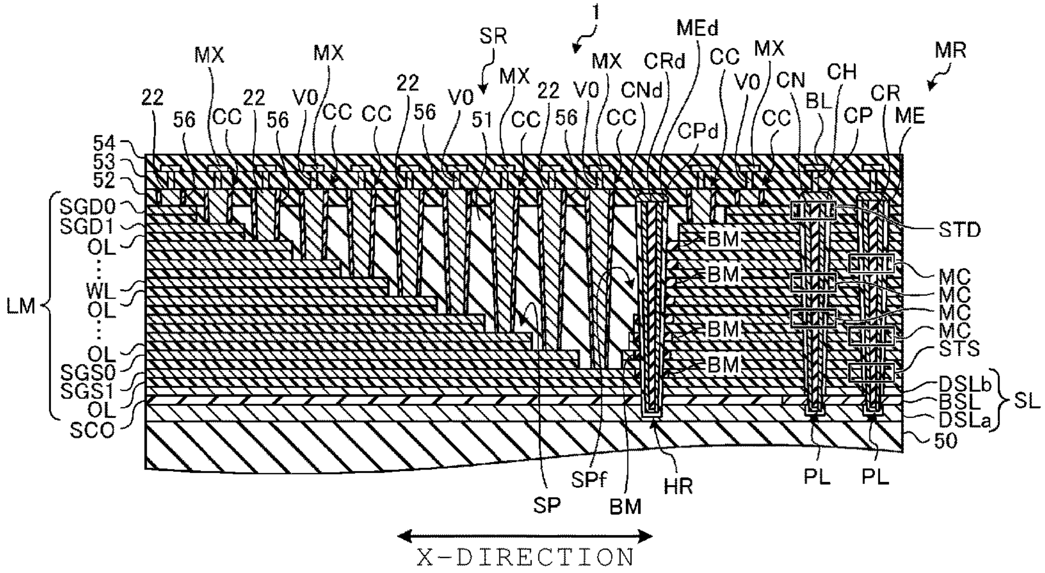
FIG. 2B
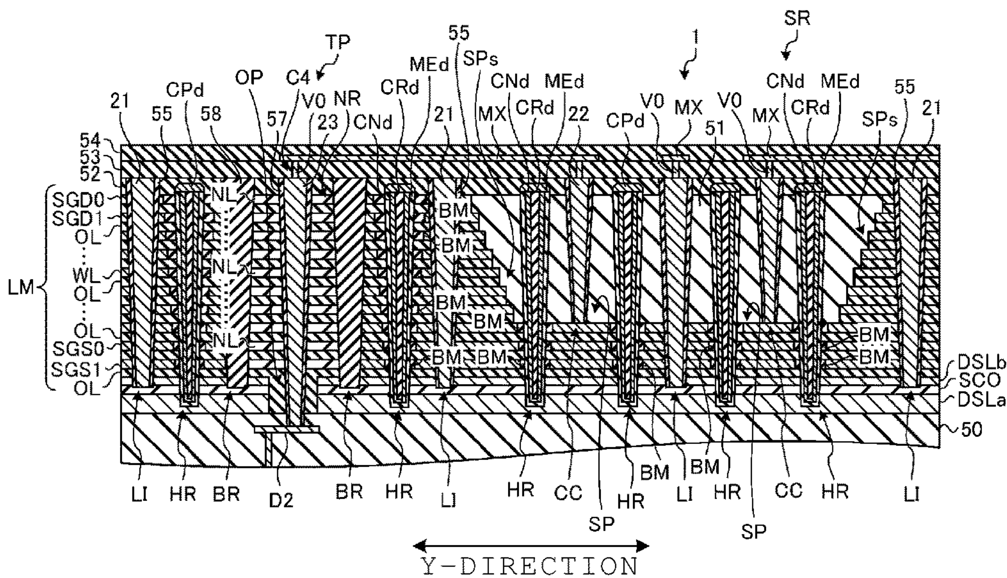
FIG. 2C
CN CR ME TN CT BK OL SGD, SGS OL PL STD,STS
FIG. 2D
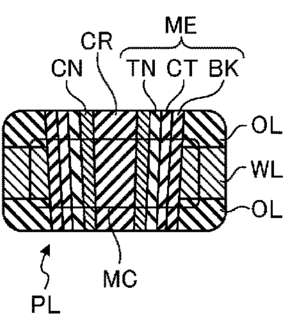
FIG. 2E
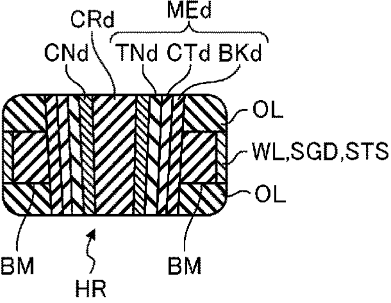

FIG. 7A
FIG. 7B
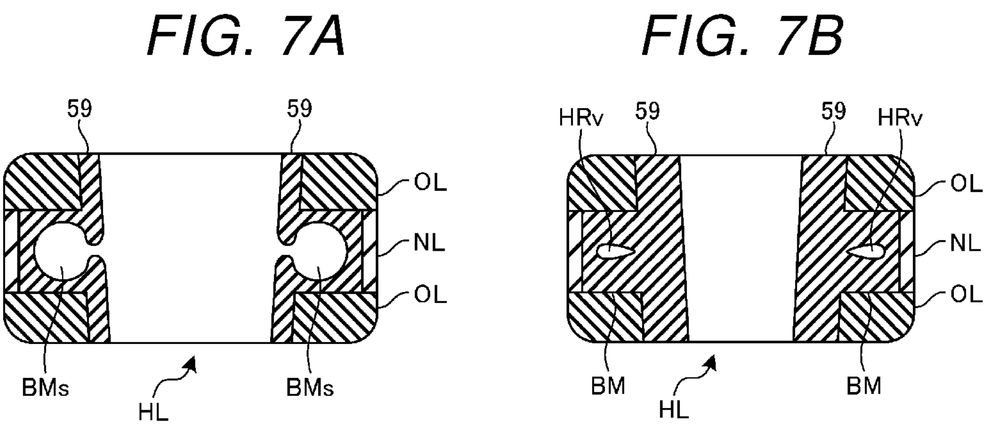
FIG. 8A
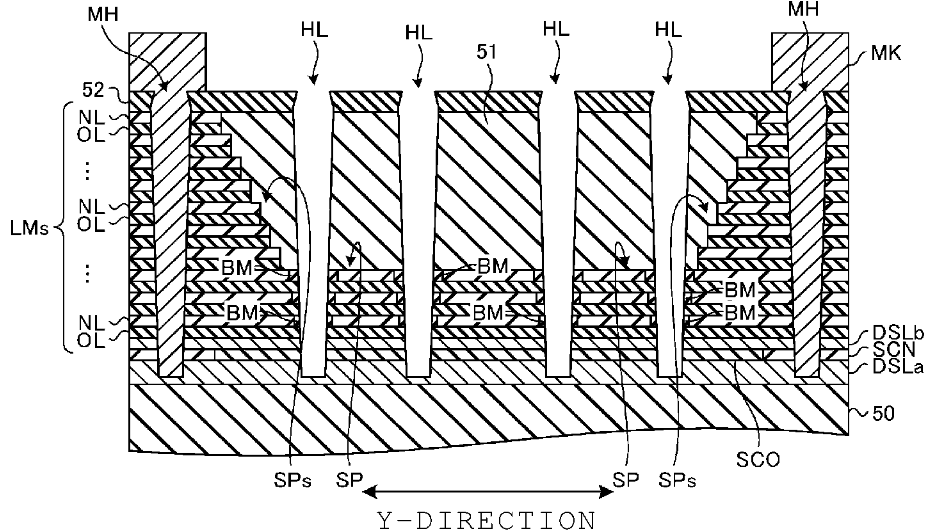
FIG. 8B
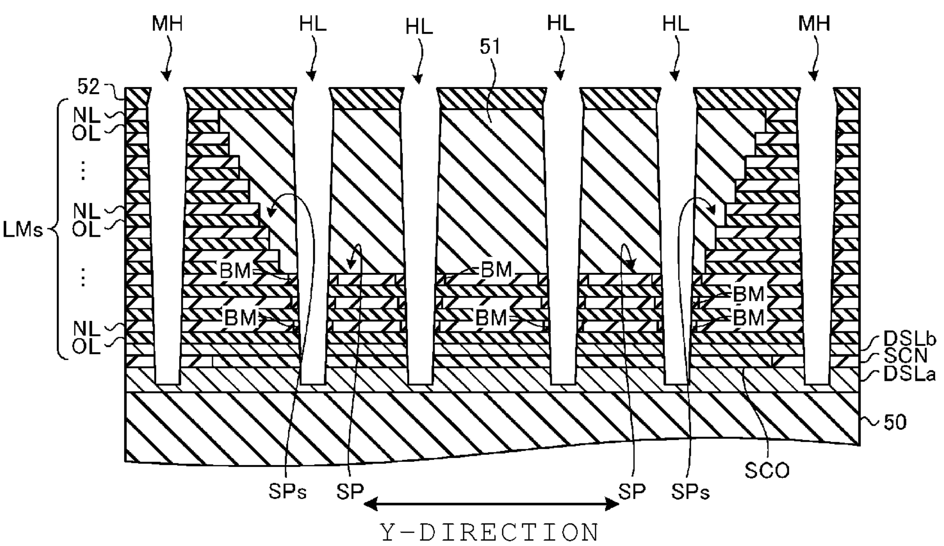

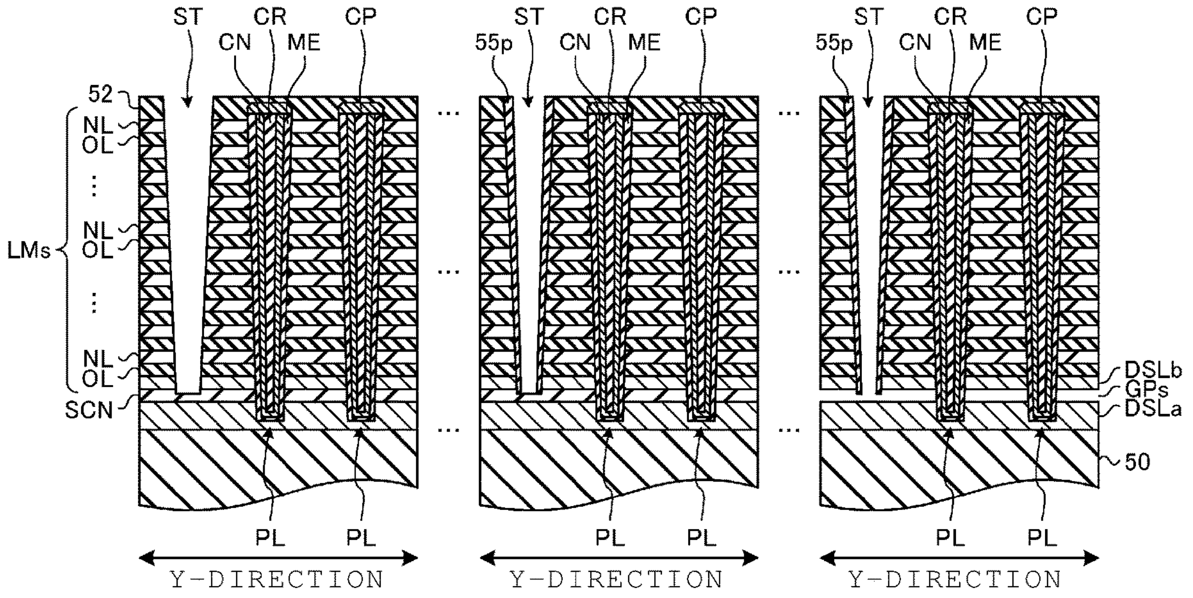
FIG. 12A
FIG. 12B
FIG. 12C
ST
CR
CN
ME
CP
55p
52
NL
OL
LMs
SCN
DSLb
GPs
DSLa
50
PL
Y-DIRECTION
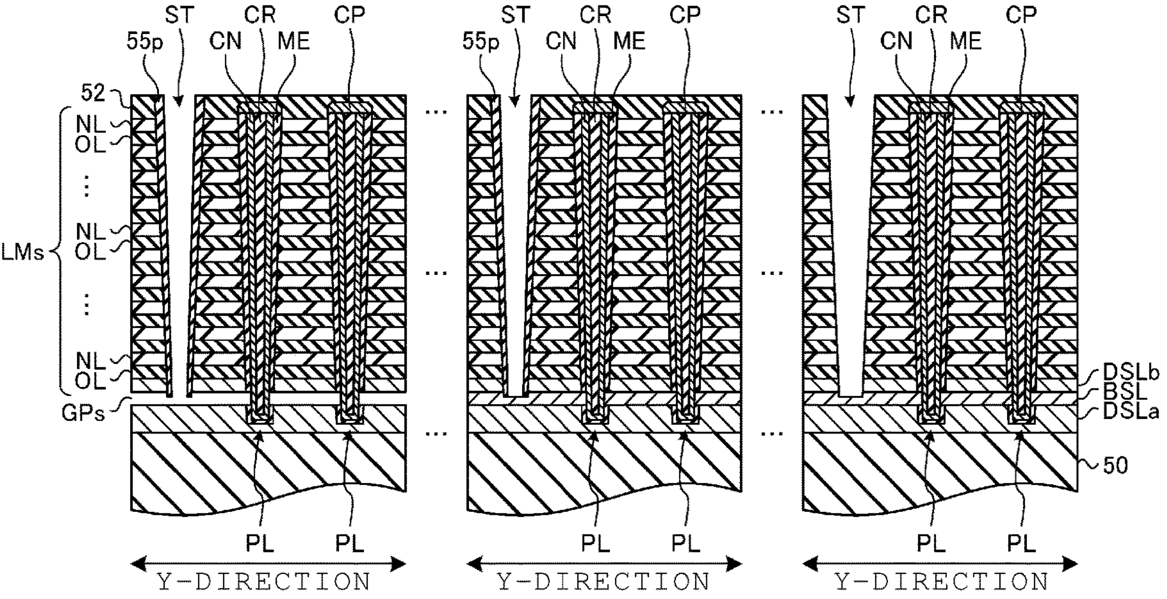
FIG. 13A
FIG. 13B
FIG. 13C
ST
CR
CN
ME
CP
55p
52
NL
OL
LMs
GPs
DSLb
BSL
DSLa
50
PL
Y-DIRECTION

SEMICONDUCTOR MEMORY DEVICE

CROSS-REFERENCE TO RELATED APPLICATION

This application is based upon and claims the benefit of priority from Japanese Patent Application No. 2022-034638, filed Mar. 7, 2022, the entire contents of which are incorporated herein by reference.

FIELD

Embodiments described herein relate generally to a semiconductor memory device.

BACKGROUND

In a semiconductor memory device such as a three-dimensional nonvolatile memory, memory cells are arranged three dimensionally within a stacked body of conductive layers and insulating layers alternating with each other. However, in certain regions, the stacked body may sink or sag in the stacking direction and thus unevenness may occur at the upper surface of the stacked body.

BRIEF DESCRIPTION OF THE DRAWINGS

FIGS. 2A to 2E are cross-sectional views illustrating an example of the configuration of a semiconductor memory device according to an embodiment.

FIGS. 3A and 3B are schematic diagrams of a columnar portion in a semiconductor memory device according to an embodiment when viewed from a stacking direction.

FIGS. 7A and 7B are diagrams illustrating aspects of a method for manufacturing a semiconductor memory device according to an embodiment.

FIGS. 8A and 8B are diagrams illustrating aspects of a method for manufacturing a semiconductor memory device according to an embodiment.

FIGS. 12A to 12C are diagrams illustrating aspects of a method for manufacturing a semiconductor memory device according to an embodiment.

FIGS. 13A to 13C are diagrams illustrating aspects of a method for manufacturing a semiconductor memory device according to an embodiment.

DETAILED DESCRIPTION

In general, according to one embodiment, there is provided a semiconductor memory device including a stacked body in which a plurality of first conductive layers and a plurality of first insulating layers are alternately stacked and which includes a staircase portion in which the plurality of first conductive layers are in a staircase shape. A pillar extends in a stacking direction through the stacked body in a region away from the staircase portion in a first direction intersecting the stacking direction and memory cells are at intersections of the pillar with at least some of the plurality of first conductive layers. A columnar portion extends in the stacking direction through the stacked body at the staircase portion. The columnar portion includes a first semiconductor layer extending in the stacking direction, a second insulating layer covering a side wall of the first semiconductor layer, and a third insulating layer covering a side wall of the second insulating layer. The third insulating layer includes a material different from that of the second insulating layer and includes a plurality of flanged portions on a sidewall thereof that protrude toward a side of the plurality of first conductive layers at height positions corresponding to the plurality of first conductive layers.

Hereinafter, certain example embodiments will be described with reference to the drawings. The present disclosure is not limited to these example embodiments, and those of ordinary skill in the art will recognize various modifications, variations, substitutions, and the like which may be made to the specifically described examples without departing from the inventive technical concepts of the present disclosure.

Configuration Example of Semiconductor Memory Device

Figure 1A:
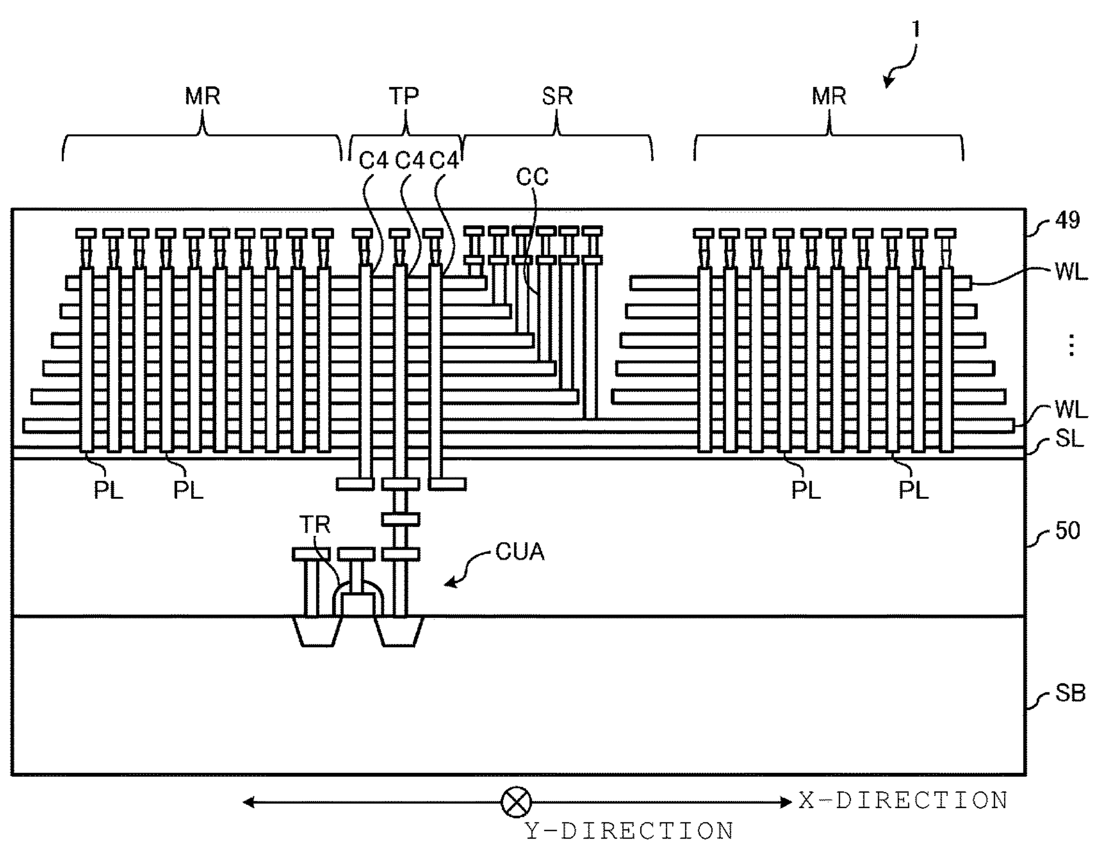
FIGS. 1A and 1B are diagrams illustrating an example of a schematic configuration of a semiconductor memory device according to an embodiment.
Figure 1B:
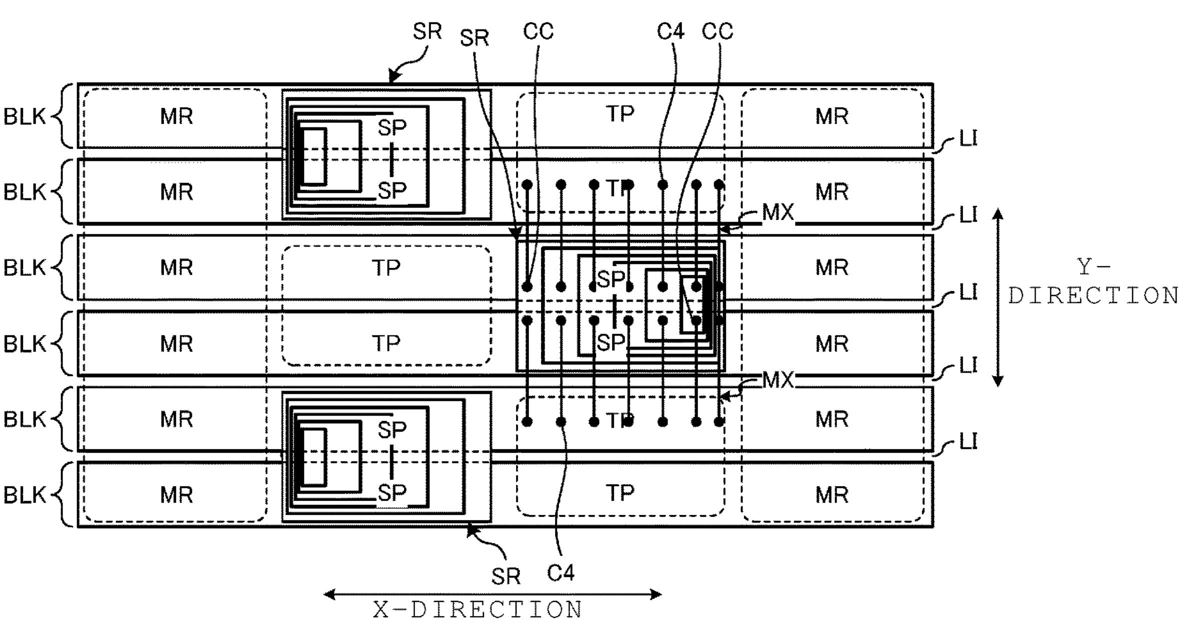

FIGS. 1A and 1B are diagrams illustrating an example of a schematic configuration of a semiconductor memory device 1 according to the embodiment. FIG. 1A is a cross-sectional view of the semiconductor memory device 1 taken across the Y-direction, and FIG. 1B is a schematic plan view illustrating a layout of the semiconductor memory device 1. In FIG. 1A, hatching is omitted in consideration of the ease of visibility of the drawing. In FIG. 1A, some select gate lines and upper layer wirings are omitted from the illustration.

As illustrated in FIGS. 1A and 1B, the semiconductor memory device 1 includes a peripheral circuit CUA, a memory region MR, a penetration contact region TP, and a staircase region SR on a substrate SB.

The substrate SB is a semiconductor substrate such as a silicon substrate. The peripheral circuit CUA includes a transistor TR, a wiring, and the like. The peripheral circuit CUA contributes to an operation of a memory cell.

The peripheral circuit CUA is covered with an insulating layer 50. A source line SL is disposed on the insulating layer 50. A plurality of word lines WL are stacked above the source line SL. The plurality of word lines WL are covered with an insulating layer 49. The insulating layer 49 also surrounds the plurality of word lines WL in an XY-plane.

A plurality of plate-shaped contacts LI penetrate the word lines WL in a stacking direction and extend in a direction along the X-direction. In this way, the plurality of word lines WL are divided into different groups or regions along the Y-direction by the plate-shaped contacts LI. The memory region MR, the staircase region SR, and the penetration contact region TP are also divided into separate groups or regions along the Y-direction. A region between two adjacent plate-shaped contacts LI adjacent in the Y-direction including a memory region MR, a staircase region SR, and a penetration contact region TP may be referred to as a block region BLK.

The memory regions MR are disposed at both X-direction ends of the word lines WL, and extend between the adjacent plate-shaped contacts LI in the Y-direction. The memory regions MR can be disposed over a plurality of block regions BLK in some examples.

A staircase region SR is disposed to both sides of a plate-shaped contact LI in the Y-direction between the memory regions MR on both ends in the X-direction. A penetration contact region TP is disposed to both sides of a plate-shaped contact LI in the Y-direction between the memory regions MR on both ends in the X-direction.

In particular, one staircase region SR and one penetration contact region TP are located along the X-direction spanning across two block region BLK widths of two block regions BLK adjacent to one plate-shaped contact LI in the Y-direction. The relative positions for the staircase region SR and the penetration contact region TP alternate back and forth in the X-direction (left-right page direction in FIG. 1B) for every two block regions BLK along the Y-direction.

As described above, in some block regions BLK, the memory region MR, the staircase region SR, the penetration contact region TP, and the memory region MR are in this order from left side to the right side. In other block regions BLK, the memory region MR, the penetration contact region TP, the staircase region SR, and the memory region MR are in this order from the left side to the right side.

In the memory region MR, a plurality of pillars PL penetrating the word lines WL in the stacking direction are disposed. A plurality of memory cells are formed at intersections of the pillars PL and the word lines WL. With this configuration, the semiconductor memory device 1 is configured as, for example, a three-dimensional nonvolatile memory in which memory cells are three-dimensionally located in the memory region MR.

The staircase region SR includes a plurality of staircase portions SP in which a plurality of word lines WL are increasingly recessed from one another with increasing distance along the stacking direction from the substrate SB. In one staircase region SR, for example, two staircase portions SP located in the Y-direction across one plate-shaped contact LI are disposed. The word lines WL in a staircase region SR may be recessed from an adjacent word line WL in both the X-direction and the Y-direction.

The staircase portion SP form sides of a terraced bowl shape, the walls of which descend in a staircase manner from both X-direction sides and one Y-direction side toward the flat bottom surface. The other Y-direction side of the staircase portion SP is open on the side facing toward a side surface of the plate-shaped contact LI.

Each stair of the staircase portion SP is composed of a word line WL on its own layer. The word line WL of each layer maintains electrical continuity on between both sides of the layer in the X-direction which are separated from one another by the staircase region SR interposed therebetween. The word line WL layer maintains electrical continuity via a staircase part running on the one Y-direction side of the staircase portion SP. Each of contacts CC connecting the word line WL of each layer and an upper layer wiring MX is disposed on an exposed terrace portion of each stair of the staircase portion SP.

With this configuration, the word lines WL stacked in multiple layers can be individually drawn out for external connection. From these contacts CC, a write voltage, a read voltage, and the like are applied to the memory cells in the memory regions MR on both sides in the X-direction via the word lines WL at the same height position (on the same layer or device level) as the respective memory cells.

In the present specification, a direction in which the terrace surface of each stair of the staircase portion SP faces is defined as an upward direction.

In the penetration contact region TP, a penetration contact C4 penetrating a plurality of word lines WL is disposed. The penetration contact C4 connects the peripheral circuit CUA disposed on the substrate SB disposed below the penetration contact C4, and the upper layer wiring MX connected to the contacts CC of the staircase portion SP. Various voltages applied to the memory cells from the contacts CC are controlled by the peripheral circuit CUA via the penetration contact C4, the upper layer wiring MX, and the like.

Next, a semiconductor memory device 1 of one example will be described with reference to FIGS. 2A to 2E. FIGS. 2A to 2E are cross-sectional views of the semiconductor memory device 1.

FIG. 2A is a cross-sectional view along the X-direction and includes the memory region MR and the staircase region SR. FIG. 2B is a cross-sectional view along the Y-direction and includes the staircase region SR and the penetration contact region TP. In FIGS. 2A and 2B, the substrate SB, the peripheral circuit CUA, and the like positioned below the insulating layer 50 are omitted from the illustration.

FIGS. 2C and 2D are partially enlarged views illustrating a cross section of the pillar PL disposed in the memory region MR. FIG. 2E is a partially enlarged view illustrating a cross section of a columnar portion HR. A columnar portion HR can be disposed in the staircase region SR or the penetration contact region TP.

First, the overall configuration of the stacked body LM on the source line SL will be described.

As illustrated in FIGS. 2A and 2B, the source line SL has a multilayer structure in which, for example, a lower source line DSLa, an intermediate source line BSL or an intermediate insulating layer SCO, and an upper source line DSLb are stacked on the insulating layer 50 in this order.

The lower source line DSLa, the intermediate source line BSL, and the upper source line DSLb are, for example, a polysilicon layer or the like. Among these lines, at least the intermediate source line BSL may be a conductive polysilicon layer or the like in which impurities (dopants) have been diffused. The intermediate source line BSL is disposed below the memory region MR of the stacked body LM.

The intermediate insulating layer SCO is, for example, a silicon oxide layer or the like. The intermediate insulating layer SCO is disposed below the staircase region SR and the penetration contact region TP of the stacked body LM and elsewhere except for in the memory region MR.

The stacked body LM is disposed on the upper source line DSLb. The word lines WL and insulating layers OL are alternately stacked one by one in the stacked body LM. Above the uppermost word line WL, select gate lines SGD0 and SGD1 are disposed in the stacked body LM via an insulating layer OL. Below the lowermost word line WL, select gate lines SGS0 and SGS1 are disposed in the stacked body LM via an insulating layer OL. The number of layers of word lines WL and select gate lines SGD and SGS in the stacked body LM can, in general, be arbitrarily selected.

The word lines WL and the select gate lines SGD and SGS are, for example, a tungsten layer, a molybdenum layer, or the like. The insulating layer OL is, for example, a silicon oxide layer or the like.

The upper surface of the stacked body LM is covered with an insulating layer 52. The insulating layer 52 is covered with an insulating layer 53. The insulating layer 53 is covered with an insulating layer 54. The insulating layers 52 to 54, together with an insulating layer 51 (see FIG. 4) may be considered parts of the insulating layer 49 depicted in FIG. 1A.

As illustrated in FIG. 2B, the stacked body LM is divided along the Y-direction by a plurality of plate-shaped contacts LI.

The plurality of plate-shaped contacts LI are located spaced from each other in the Y-direction and extend along the stacking direction and the X-direction as a generally plate-shaped member. That is, a plate-shaped contact LI penetrates the insulating layer 52, the stacked body LM, and the upper source line DSLb, reaches the intermediate insulating layer SCO (in the staircase region SR, the penetration contact region TP, and the like) and also reaches the intermediate source line BSL (in the memory region MR). The plate-shaped contact LI continuously extends in the X-direction inside the stacked body LM from one end portion to the other end portion of the stacked body LM.

The plate-shaped contact LI has, for example, a tapered shape by which the width in the Y-direction decreases from an upper end portion to a lower end portion. Alternatively, the plate-shaped contact LI may have a bowing shape with a maximum width in the Y-direction at some position between the upper end portion and the lower end portion of the stacked body LM.

Each of the plate-shaped contacts LI includes an insulating layer 55 and a conductive layer 21. The insulating layer 55 is, for example, a silicon oxide layer or the like. The conductive layer 21 is, for example, a tungsten layer, a conductive (doped) polysilicon layer, or the like.

The insulating layer 55 covers side walls facing each other in the Y-direction of the plate-shaped contact LI. The conductive layer 21 is filled inside the insulating layer 55 and is electrically connected to the source line SL (including the intermediate source line BSL) at a position different from that represented in the cross section of FIG. 2B. Further, as illustrated in FIG. 2B, the conductive layer 21 is connected to the upper layer wiring MX disposed in the insulating layer 54 via a plug V0 disposed in the insulating layer 53. With such a configuration, the plate-shaped contact LI functions as a source line contact.

However, in some instances, instead of the plate-shaped contact LI, a similarly shaped and disposed plate-shaped member filled with insulating material may penetrate the stacked body LM and extend in the direction along the X-direction, thereby dividing the stacked body LM in the Y-direction. In this case, such a plate-shaped member does not function as a source line contact.

Further, in a region between adjacent plate-shaped contacts LI (referred to as a block region BLK (see FIG. 1B)), the select gate lines SGD0 and SGD1 on the upper layer side of the stacked body LM are further separated into a plurality of partitions by a separation layer comprising a silicon oxide or the like. In other words, one or more conductive layers including the uppermost conductive layer of the stacked body LM are partitioned into a pattern of select gate lines SGD by a separation layer (or structure) that penetrates these upper conductive layers.

Next, a configuration of the pillar PL illustrated in FIGS. 2A, 2C, and 2D will be described.

As illustrated in FIG. 2A, in the memory region MR, a plurality of pillars PL that penetrate the stacked body LM, the upper source line DSLb, and the intermediate source line BSL and reach the lower source line DSLa are disposed.

The plurality of pillars PL have, for example, a staggered arrangement when viewed from the stacking direction. Each pillar PL has a circular shape, an elliptical shape, or an oval shape in an XY-plane cross-section. The pillar PL may have a tapered shape in which a diameter (and a cross-sectional area) decrease from an upper end portion to a lower end portion. Alternatively, the pillar PL has a bowing shape having a maximum diameter (and cross-sectional area) at some position along the stacking direction between the upper end portion and the lower end portion.

Each of the pillars PL includes a memory layer ME (extending in the stacking direction), a channel layer CN (which penetrates the stacked body LM and connects to the intermediate source line BSL), a cap layer CP (which covers the upper surface of the channel layer CN), and a core layer CR (forming the core, or central portion, of the pillar PL).

As illustrated in FIGS. 2C and 2D, the memory layer ME has a multilayer structure in which a block insulating layer BK, a charge storage layer CT, and a tunnel insulating layer TN are stacked in this order from the outer peripheral side of the pillar PL. More specifically, the memory layer ME is disposed on the side surface of the pillar PL except for a depth position of the intermediate source line BSL. The memory layer ME is disposed on the bottom surface of the pillar PL that reaches a depth of the lower source line DSLa.

The channel layer CN penetrates the stacked body LM, the upper source line DSLb, and the intermediate source line BSL in the stacking direction and reaches the lower source line DSLa in the memory layer ME. The channel layer CN is in contact with the intermediate source line BSL on the side surface, thereby being electrically connected to the source line SL. The core layer CR is filled further in the channel layer CN.

Each of the pillars PL includes the cap layer CP at an upper end portion thereof. The cap layer CP is disposed in the insulating layer 52 so as to cover at least an upper end portion of the channel layer CN, and is connected to the channel layer CN. The cap layer CP is connected to a bit line BL (in the insulating layer 54) via a plug CH (in the insulating layers 52 and 53).

The block insulating layer BK and the tunnel insulating layer TN of the memory layer ME, and the core layer CR are, for example, a silicon oxide layer or the like. The charge storage layer CT of the memory layer ME is, for example, a silicon nitride layer or the like. The channel layer CN and the cap layer CP are semiconductor layers such as a polysilicon layer or an amorphous silicon layer.

As illustrated in FIG. 2D, a memory cell MC is formed at each part of the side surface of the pillar PL facing each word line WL by the above configuration. By applying a predetermined voltage from the word line WL, data is written to and read from the memory cell MC.

As illustrated in FIG. 2C, select gates STD are formed where the side surface of the pillar PL faces the select gate lines SGD0 and SGD1 disposed above the word lines WL. Select gates STS are formed where the side surface of the pillar PL faces the select gate lines SGS0 and SGS1 disposed below the word lines WL.

By applying a predetermined voltage from the select gate lines SGD and SGS, the select gates STD and STS can be turned on or off, and the memory cells MC of the pillar PL to which the select gates STD and STS belong can be placed in a selected state or a non-selected state.

Next, a configuration of staircase region SR illustrated in FIGS. 2A and 2B will be described.

As illustrated in FIGS. 2A and 2B, a plate-shaped contact LI divides the staircase region SR in the Y-direction (see also FIG. 1B). In the staircase region SR, there is a staircase portion SP, a staircase portion SPf, and a staircase portion SPs on both sides of the plate-shaped contact LI in the Y-direction. The staircase portions SP, SPf, and SPs each have a shape in which the word lines WL and insulating layers OL are processed into a staircase shape.

The staircase portion SP permits the electrically drawing out (connecting) of the plurality of word lines WL to the upper layer wiring MX. On the other hand, the staircase portion SPs and the portion of the staircase portion SPf where the word line WL and the select gate lines SGS0 and SGS1 of the lower layer are processed in a staircase shape are dummy staircase portions that are not specifically used for the electrical functioning of the semiconductor memory device 1. Such dummy staircase portions may be disposed at either side in the X-direction and either side in the Y-direction of the stacked body LM.

The staircase portion SP extends in the X-direction from a position proximate to a penetration contact region TP toward an adjacent memory region MR in the X-direction, and descends in a direction approaching the memory region MR. The staircase portion SPf extends in the X-direction so as to face the staircase portion SP at a position closer to the memory region MR, and descends in a direction approaching the staircase portion SP.

The staircase portion SPs faces the plate-shaped contact LI that divides the staircase region SR in the Y-direction at a position between the staircase portions SP and SPI, and the like, and is disposed at a position in the vicinity of a plate-shaped contact LI adjacent to the plate-shaped contact LI in the Y-direction. The staircase portion SPs descends in a direction approaching the plate-shaped contact LI facing in the Y-direction.

In the staircase portion SPs and in a portion where the word line WL and the select gate lines SGS0 and SGS1 of the staircase portion SPf are processed in the staircase shape, the terrace portion of each stair is shorter than the terrace portion of the staircase portion SP. Therefore, the staircase portions SPs and SPf have a steeper slope than the staircase portion SP, and a staircase length, that is, a distance from an uppermost stair to a lowermost stair is shorter than that of the staircase portion SP.

By locating the staircase portions SP, SPI, and SPs in this way, the stacked body LM forms a bowl-like shape (a recessed shape terraced/stepped with sidewalls) at the staircase region SR. In the bowl-like region, the insulating layer 51 such as a silicon oxide layer covers otherwise exposed upper surfaces of the staircase portions SP, SPf, and SPs.

The insulating layer 51 is also divided in the Y-direction by the plate-shaped contact LI running through the staircase region SR. The insulating layers 52 to 54 cover the upper surface of the insulating layer 51.

The contacts CC penetrating the insulating layers 52 and 51 are connected to the word lines WL and the select gate lines SGD and SGS. The contacts CC connected to the select gate lines SGD0 and SGD1 are also disposed on the terrace surfaces of the select gate lines SGD0 and SGD1 in the staircase portion SPf.

Each contact CC has, for example, a tapered shape whose diameter (and thus cross-sectional area) decreases from an upper end portion to a lower end portion. Alternatively, the contact CC has a bowing shape having a maximum diameter (and thus cross-sectional area) at some intermediate position between the upper end portion and the lower end portion.

The contact CC includes an insulating layer 56 that covers the outer periphery of the contact CC, and a conductive layer 22 such as a tungsten layer or a copper layer that is filled in the insulating layer 56. The conductive layer 22 is connected to the upper layer wiring MX disposed in the insulating layer 54 via the plug V0 disposed in the insulating layer 53. As described above, the upper layer wiring MX is connected to the penetration contact C4 of the penetration contact region TP adjacent in the Y-direction via, for example, the plate-shaped contact LI.

With such a configuration, the word line WL of each layer and the select gate lines SGD and SGS of the upper and lower layers of the word line WL can be electrically drawn out. That is, according to the above configuration, a predetermined voltage can be applied from the peripheral circuit CUA to the memory cell MC via the penetration contact C4, the contact CC, the word line WL, and the like to operate the memory cell MC as a storage element.

Here, FIG. 2B illustrates a cross section of a third stair from the lowest stair of the staircase portion SP. That is, FIG. 2B illustrates a portion where the word line WL of the lowermost layer becomes the terrace surface. In FIG. 2B, the staircase portions SP are respectively disposed on both sides of the plate-shaped contact LI illustrated in the central portion of the staircase region SR in the Y-direction. The staircase portions SPs are respectively disposed on the opposite sides of the plate-shaped contact LI in the Y-direction of each staircase portion SP.

Next, the configuration of the columnar portion HR illustrated in FIGS. 2A, 2B, and 2E will be described.

As illustrated in FIGS. 2A and 2B, in a partial region of the staircase region SR including the staircase portions SP, SPf, SPs, a plurality of columnar portions HR that penetrate the insulating layer 51, the stacked body LM, the upper source line DSLb, and the intermediate insulating layer SCO and reach the lower source line DSLa are dispersedly disposed.

The plurality of columnar portions HR take a staggered or grid-like arrangement while avoiding interference with the plate-shaped contact LI and the contact CC.

Each columnar portion HR has a shape such as a circular shape, an elliptical shape, or an oval shape as a cross-sectional shape in the direction along the XY-plane. For example, the columnar portion HR has a tapered shape in which a diameter (or a cross-sectional area) decreases from an upper end portion to a lower end portion, for example. Alternatively, the columnar portion HR has a bowing shape having a maximum diameter (or cross-sectional area) at some intermediate position between the upper end portion and the lower end portion.

Each of the plurality of columnar portions HR has at least a part thereof extending in the stacked body LM in the stacking direction. The columnar portions HR have the same layer structure as the pillar PL described above and include a plurality of flanged portions BM at the outer edge portion of the columnar portion HR in the stacked body LM. However, the plurality of columnar portions HR are in a floating state as a whole and do not specifically contribute to the functions of the semiconductor memory device 1. As will be described later, when forming the stacked body LM from the stacked body in which sacrificial layers and the insulating layers OL are stacked, the columnar portion HR has a role of supporting these configurations.

Furthermore, as described above, by locating the columnar portion HR to avoid interference with the plate-shaped contact LI and the contact CC, the influence of the columnar portion HR, which includes a silicon nitride layer corresponding to the charge storage layer CT of the pillar PL is prevented. That is, by preventing the columnar portion HR from coming into contact with the plate-shaped contact LI or the contact CC, adverse interference is avoided.

Since the columnar portion HR has the same layer structure as the pillar PL, the columnar portion HR includes dummy layers MEd, CNd, CRd, and CPd.

The columnar portion HR also has a plurality of flanged portions BM protruding from a side wall of a dummy layer MEd toward a side of the plurality of word lines WL and the select gate lines SGD and SGS at the height positions of the plurality of word lines WL and the select gate lines SGD and SGS of the stacked body LM.

The flanged portions BM widen substantially concentrically from the outer periphery of the dummy layer MEd at the same height position as the respective flanged portions BM, when viewed from the stacking direction. Therefore, when the columnar portion HR has, for example, a circular cross-sectional shape, the plurality of word lines WL and the select gate lines SGD and SGS surround the columnar portions HR at substantially equal distance from the center of the columnar portion HR, when viewed from the stacking direction.

The flanged portion BM is provided on a side wall of a dummy layer MEd part extending in the stacked body LM of the dummy layer MEd that penetrates the insulating layer 51 and the stacked body LM and extends in the stacking direction, but is not disposed on a side wall of a dummy layer MEd part extending in the insulating layer 51.

As illustrated in FIG. 2E, the dummy layer MEd of the columnar portion HR has a multilayer structure in which the dummy layers BKd, CTd, and TNd are stacked in this order from the outer peripheral side of the columnar portion HR. That is, the dummy layer MEd corresponds to the memory layer ME of the pillar PL described above. Further, the dummy layers BKd, CTd, and TNd in the dummy layer MEd correspond to the block insulating layer BK, the charge storage layer CT, and the tunnel insulating layer TN of the pillar PL, respectively.

However, the dummy layer MEd is disposed on the side surface of the columnar portion HR from the upper source line DSLb to the lower source line DSLa without being disconnected. The dummy layer MEd is also disposed at a lower end portion of the columnar portion HR.

The dummy layer CNd penetrates the stacked body LM, the upper source line DSLb, and the intermediate insulating layer SCO, extends in the stacking direction, and reaches the depth of the lower source line DSLa in the dummy layer MEd. The dummy layer CNd corresponds to the channel layer CN of the pillar PL described above.

However, the dummy layer MEd is disposed on the side surface of the dummy layer CNd from the upper source line DSLb to the lower source line DSLa, and the dummy layer CNd is not directly in contact with the intermediate insulating layer SCO. The dummy layer CNd is also disposed at the lower end portion of the columnar portion HR via the dummy layer MEd.

Further in the dummy layer CNd is filled with a dummy layer CRd which is a core material of the columnar portion HR. That is, the dummy layer CRd corresponds to the core layer CR of the pillar PL described above.

Further, each of the plurality of columnar portions HR includes a dummy layer CPd at the upper end portion thereof. The dummy layer CPd is disposed in the insulating layer 52 so as to cover at least an upper end portion of the dummy layer CNd, and is connected to the dummy layer CNd. The dummy layer CPd corresponds to the cap layer CP of the pillar PL described above. The columnar portion HR may not include the dummy layer CPd.

Each layer of the dummy layers MEd, CNd, CRd, and CPd in the columnar portion HR contains the same material as each layer of the corresponding pillar PL. That is, the dummy layers BKd and TNd of the dummy layer MEd and the dummy layer CRd are, for example, a silicon oxide layer or the like. A dummy layer CTd is, for example, a silicon nitride layer or the like. The dummy layers CNd and CPd are a semiconductor layer such as, for example, a polysilicon layer or an amorphous silicon layer. Here, the semiconductor layer in the dummy layer CNd or the like has a higher Young's modulus than, for example, materials contained in other dummy layers MEd and CRd, and has a property of being hard and hardly deformed.

Further, the plurality of flanged portions BM of the columnar portion HR are, for example, a silicon oxide layer or the like. Each of the plurality of flanged portions BM protrudes from a side wall of a dummy layer BKd positioned on an outermost periphery of the dummy layer MEd toward the side of the plurality of word lines WL and the select gate lines SGD and SGS.

Next, a detailed configuration of the penetration contact region TP illustrated in FIG. 2B will be described.

As illustrated in FIG. 2B, an insulating portion NR, a plate-shaped portion BR, the penetration contacts C4, and the columnar portion HR are disposed in the penetration contact region TP.

The insulating portion NR is a part which is surrounded by the stacked body LM when viewed from the stacking direction, and in which a plurality of insulating layers NL and the plurality of insulating layers OL are alternately stacked one by one. The plurality of insulating layers NL are, for example, a silicon nitride layer or the like, and are disposed at the height positions of the plurality of word lines WL and the select gate lines SGD and SGS, respectively.

The plate-shaped portions BR are respectively disposed on both sides of the insulating portion NR in the Y-direction. At a position between the plate-shaped contacts LI adjacent to each other in the Y-direction, the plate-shaped portion BR extends in the penetration contact region TP in the direction along the X-direction, penetrates the stacked body LM and the upper source line DSLb, and reaches the intermediate insulating layer SCO.

As will be described later, when the stacked body LM is formed from the stacked body in which the sacrificial layers and the insulating layers OL are stacked, in the part interposed between the plate-shaped portions BR, the sacrificial layer remains without being replaced by the word line WL or the like, and is maintained as the insulating layer NL of the insulating portion NR.

A plurality of penetration contacts C4 are located in the insulating portion NR, for example, in the direction along the X-direction (see FIG. 1A). However, the plurality of penetration contacts C4 may be located in the Y-direction in the penetration contact region TP instead of or in addition to the X-direction.

The penetration contact C4 penetrates the insulating layer 52 and the insulating portion NR, and also passes through, for example, an opening OP provided in the source line SL to reach the insulating layer 50 covering the peripheral circuit CUA (see FIG. 1A).

The penetration contact C4 includes an insulating layer 57 that covers an outer periphery of the penetration contact C4 and a conductive layer 23 such as a tungsten layer or a copper layer filled in the insulating layer 57.

The conductive layer 23 is connected to the upper layer wiring MX disposed in the insulating layer 54 via the plug V0 disposed in the insulating layer 53, above the stacked body LM. Further, the conductive layer 23 is connected to the peripheral circuit CUA via a lower layer wiring D2 disposed in the insulating layer 50, below the stacked body LM. With this configuration, the penetration contact C4 connects the configurations disposed above and below the stacked body LM.

The penetration contact C4 is disposed in the insulating portion NR which does not include the word line WL or the like, and the conductive layer 23 of the penetration contact C4 is also covered with the insulating layer 57, thereby maintaining a breakdown voltage between the penetration contact C4 and the word line WL or the like of the stacked body LM.

FIG. 2B illustrates one side of the penetration contact regions TP disposed on both sides in the Y-direction with one plate-shaped contact LI interposed therebetween. On the left side of the plate-shaped contact LI at the left end of the paper surface in FIG. 2B, the insulating portion NR interposed between the plate-shaped portions BR on both sides in the Y-direction, the penetration contact C4 in the insulating portion NR, and the like are disposed, and a plurality of columnar portions HR are also dispersedly disposed between the plate-shaped contact LI and the plate-shaped portion BR.

Further, the staircase region SR described above is disposed on the opposite side of the penetration contact region TP in the Y-direction (on the right side of the paper surface) with the second plate-shaped contact LI from the left side of the paper surface of FIG. 2B interposed therebetween.

In the penetration contact region TP except for the insulating portion NR, a plurality of columnar portions HR that penetrate the stacked body LM, the upper source line DSLb, and the intermediate insulating layer SCO and reach the lower source line DSLa are dispersedly disposed.

The plurality of columnar portions HR take a staggered or grid-like arrangement while avoiding interference with the plate-shaped contact LI. The columnar portion HR is provided with the plurality of flanged portions BM in addition to the same layer structure as, for example, the pillar PL, similarly to the above-mentioned columnar portion HR disposed in the staircase region SR.

Further, similarly to the above-mentioned columnar portion HR disposed in the staircase region SR, each of the plurality of columnar portions HR is in a floating state as a whole and does not contribute to a function of the semiconductor memory device 1. When forming the stacked body LM from the stacked body in which the sacrificial layers and the insulating layers OL are stacked, the columnar portion HR of the penetration contact region TP also has a role of supporting these configurations.

As described above, by locating the columnar portion HR while avoiding interference with the plate-shaped contact LI, the influence of the columnar portion HR, which includes the silicon nitride layer corresponding to the charge storage layer CT of the pillar PL, coming into contact with the plate-shaped contact LI is prevented.

At the same height position of the stacked body LM, a cross-sectional area of the columnar portion HR disposed in the staircase region SR and the penetration contact region TP in the direction along the XY-plane is larger than, for example, a cross-sectional area of the pillar PL in the direction along the XY-plane. Further, a pitch between the plurality of columnar portions HR is larger than, for example, a pitch between the plurality of pillars PL, and an arrangement density of the columnar portion HR per unit area of the word line WL in the stacked body LM is lower than an arrangement density of the pillar PL per unit area of the word line WL.

In this way, by making the cross-sectional area of the pillar PL smaller than that of the columnar portion HR and making the pitch narrow, a larger number of memory cells MC can be formed at a higher density in the stacked body LM within a fixed size, and a storage capacity of the semiconductor memory device 1 can be increased. On the other hand, since the columnar portion HR is used exclusively for supporting the stacked body LM, the manufacturing load can be reduced by not adopting a precise configuration having a small cross-sectional area and a narrow pitch like, for example, the pillar PL.

Next, a more detailed configuration of the columnar portion HR will be described with reference to FIGS. 3A and 3B.

Figures 3A, 3B:
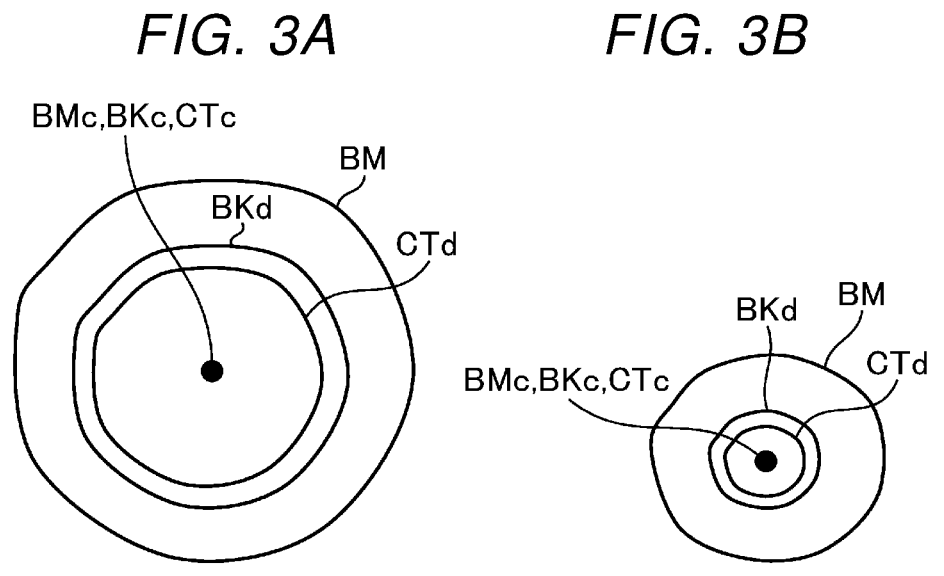

FIGS. 3A and 3B are schematic diagrams of the columnar portion HR in the semiconductor memory device 1 according to the embodiment when viewed from the stacking direction. FIG. 3A is a schematic diagram illustrating an outer shape of the columnar portion HR on an upper layer side of the stacked body LM, and FIG. 3B is a schematic diagram illustrating an outer shape of the columnar portion HR on a lower layer side of the stacked body LM.

FIG. 3A illustrates a cross-sectional shape of the flanged portion BM and a center position BMc of the cross section thereof, a cross-sectional shape of the dummy layer BKd and a center position BKc of the cross section thereof, and a center position CTc of a cross section of the dummy layer CTd, at a height position of a particular word line WL disposed on the upper layer side of the stacked body LM, when viewed from the stacking direction.

As illustrated in FIG. 3A, at the height position of the particular word line WL on the upper layer of the stacked body LM, the center position BMc of the flanged portion BM, the center position BKc of the dummy layer BKd, and the center position CTc of the dummy layer CTd are all substantially coincident with each other.

Further, at the height position of the particular word line WL on the upper layer of the stacked body LM, the cross-sectional shape of the flanged portion BM, the cross-sectional shape of the dummy layer BKd, and a cross-sectional shape of the dummy layer CTd are substantially similar in shape.

In this way, at the height position of the particular word line WL on the upper layer of the stacked body LM, an outer edge portion of the flanged portion BM, an outer edge portion of the dummy layer BKd, and an outer edge portion of the dummy layer CTd are located substantially concentrically.

The above-mentioned relationship between the flanged portion BM and the dummy layers BKd and CTd can be maintained in the entire columnar portion HR extending in the stacked body LM. Therefore, for example, the above relationship is also applicable on the lower layer side of the stacked body LM illustrated in FIG. 3B.

FIG. 3B illustrates a cross-sectional shape of the flanged portion BM and a center position BMc of the cross section thereof, a cross-sectional shape of the dummy layer BKd and a center position BKc of the cross section thereof, and a center position CTc of a cross section of the dummy layer CTd, at a height position of a particular word line WL disposed on the lower layer side of the stacked body LM, when viewed from the stacking direction LM.

As illustrated in FIG. 3B, at the height position of the particular word line WL on the lower layer of the stacked body LM, the center position BMc of the flanged portion BM, the center position BKc of the dummy layer BKd, and the center position CTc of the dummy layer CTd are all substantially coincident with each other.

At the height position of the particular word line WL on the lower layer of the stacked body LM, the cross-sectional shape of the flanged portion BM, the cross-sectional shape of the dummy layer BKd, and the cross-sectional shape of the dummy layer CTd are substantially similar in shape.

In this way, even at the height position of the particular word line WL on the lower layer of the stacked body LM, the outer edge portion of the flanged portion BM, the outer edge portion of the dummy layer BKd, and the outer edge portion of the dummy layer CTd are located substantially concentrically.

By the way, in the columnar portion HR disposed in, for example, the staircase region SR, a layer structure in the columnar portion HR may be difficult to distinguish from a configuration around the columnar portion HR. For example, the dummy layer BKd and the flanged portion BM in the columnar portion HR, and the insulating layer OL in the stacked body LM are all configured to contain the same kind of material such as a silicon oxide layer or the like.

Therefore, when analyzing with a scanning electron microscope (SEM) or the like, the boundaries between the dummy layer BKd, the flanged portion BM, and the insulating layer OL may not be detected. The state is illustrated in FIG. 4.

Figure 4:
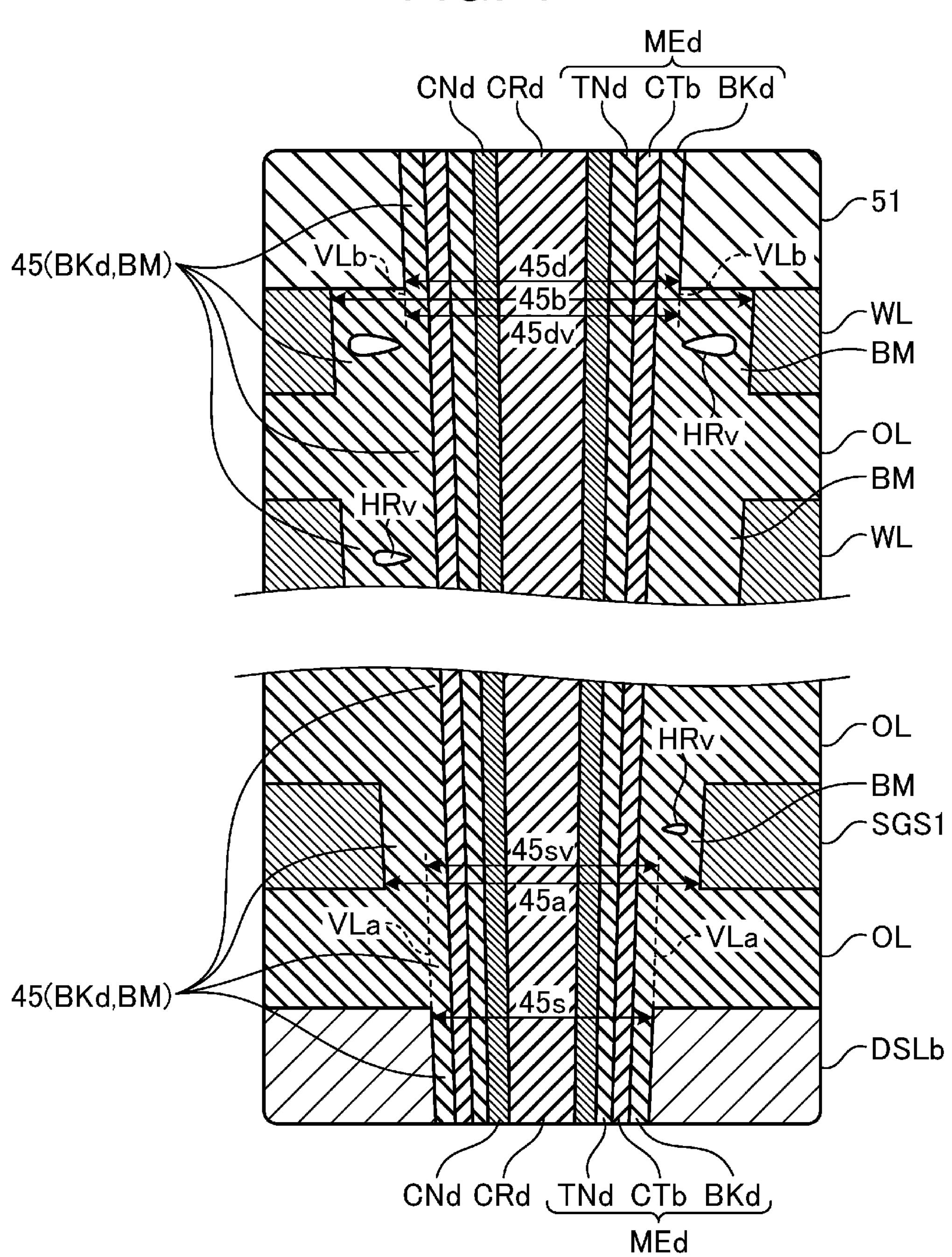
FIG. 4 is an enlarged cross-sectional view of a columnar portion in a semiconductor memory device according to an embodiment.

FIG. 4 is an enlarged cross-sectional view of the columnar portion HR in the semiconductor memory device 1 according to the embodiment. An example of FIG. 4 illustrates a state in which none of the interfaces of the dummy layer BKd and the flanged portion BM in the columnar portion HR and the insulating layer OL in the stacked body LM can be distinguished.

As illustrated in FIG. 4, in the above case, the dummy layer BKd and the flanged portion BM can be observed as the insulating layer 45 which is mixed and integrated with the insulating layer OL or the like. Even in this case, by paying attention to any one of the following points, it can be distinguished that the columnar portion HR is provided with the flanged portion BM on the side wall.

The first point to pay attention to is a void HRv in the flanged portion BM. In processing of forming the flanged portion BM, which will be described later, one or more of the plurality of flanged portions BM may have the void HRv inside. If the void HRv can be detected in the insulating layer 45 at the height position of the word line WL or the like, it can be seen that a structure different from that of the dummy layer BKd such as the flanged portion BM is interposed between a side wall of the dummy layer BKd covering the dummy layer CTd and an end surface on the columnar portion HR side such as the word line WL.

The second point to note is the difference between an outer diameter of the columnar portion HR extending in the source line SL disposed below the staircase portion SP and an outer diameter of the columnar portion HR extending in the staircase portion SP. That is, the diameter of the columnar portion HR in a layer of a select gate line SGS1 of the lowermost layer of the staircase portion SP in which the columnar portion HR is disposed can be compared with the diameter of the columnar portion HR in the source line SL below the layer of the select gate line SGS1.

In the example of FIG. 4, in the depicted columnar portion HR, the insulating layer 45 has an outer diameter 45*a* at the height position of the select gate line SGS1 of the lowermost layer through which the columnar portion HR penetrates. The outer diameter 45*a* actually corresponds to a diameter of the outer edge portion of the flanged portion BM protruding toward a side of the select gate line SGS1.

Further, in the same columnar portion HR, the insulating layer 45 has an outer diameter 45*s* at the height position of an upper end portion of the upper source line DSLb below the select gate line SGS1. In the example of FIG. 4, the upper end portion of the upper source line DSLb is a part in contact with a lower surface of the insulating layer OL of the lowermost layer of the stacked body LM. However, another insulating layer or the like may be interposed between the upper source line DSLb and the lowermost insulating layer OL. In this case, the upper end portion of the upper source line DSLb can be a part where the upper source line DSLb is in contact with the lower surface of the other insulating layer.

Here, it is assumed that there is a virtual line VLa in which an outer edge portion of the insulating layer 45 at a height position of the upper end portion of the upper source line DSLb is extended to a height position of an upper select gate line SGS1, that is, a position at which the insulating layer 45 has the outer diameter 45*a*. In the example of FIG. 4, at a height position of the select gate line SGS1, a region surrounded by the virtual line VLa has an outer diameter 45*sv*.

As described above, when the columnar portion HR has, for example, a tapered shape or a bowing shape, the outer diameter 45*sv* may be slightly greater than the outer diameter 45*s*. When the columnar portion HR has, for example, a substantially vertical shape, the outer diameter 45*sv* and the outer diameter 45*s* are equal to each other.

In any of the above cases, when the columnar portion HR includes the flanged portion BM, the outer diameter 45*a* of the insulating layer 45 at the height position of the select gate line SGS1 is larger than the outer diameter 45*sv* of the region surrounded by the virtual line VLa in which the outer edge portion of the insulating layer 45 at the height of the upper end portion of the upper source line DSLb is extended to the height position of the upper select gate line SGS1.

In other words, when the columnar portion HR includes the flanged portion BM, the outer edge portion of the insulating layer 45 at the height position of the select gate line SGS1 of the lowermost layer of the stacked body LM is positioned outside the region surrounded by the virtual line VLa in which the outer edge portion of the insulating layer 45 at the height position of the upper end portion of the upper source line DSLb is extended to the height position of the upper select gate line SGS1.

In some examples, the columnar portion HR may have a diameter that becomes smaller in a discontinuous manner at the source line SL including the upper source line DSLb than in the stacked body LM on the source line SL. The fact that there is a discontinuous change in the diameter of the columnar portion HR between the inside of the stacked body LM and the inside of the upper source line DSLb can be distinguished, for example, by the fact that the dummy layers CTd, CNd, CRd and the like have a step at a boundary part between the stacked body LM and the upper source line DSLb.

On the other hand, as in the example illustrated in FIG. 4, the fact that there is no discontinuous change in the diameter of the columnar portion HR between the inside of the stacked body LM and the inside of the upper source line DSLb can be distinguished by the fact that the dummy layers CTd, CNd, CRd, and the like do not have the step at the boundary part between the stacked body LM and the upper source line DSLb.

As described above, for example, when the diameter of the columnar portion HR changes discontinuously, when comparing the outer diameter 45*a* of the insulating layer 45 in the select gate line SGS1 with the outer diameter 45*sv* of the region surrounded by the virtual line VLa, it is preferable to analyze together with the result of comparing the outer diameter of the dummy layer CTd at the height position of the select gate line SGS1 with the outer diameter of the region surrounded by the virtual line in which the outer edge portion of the dummy layer CTd at the height position of the upper end portion of the upper source line DSLb is extended upward.

When a difference between the outer diameter 45*a* of the insulating layer 45 in the select gate line SGS1 and the outer diameter 45*sv* of the region surrounded by the virtual line VLa is larger than a difference between the outer diameters of the dummy layers CTd at the same height position as the select gate line SGS1 and the surrounded region by some predetermined amount, it can be seen that the columnar portion HR includes the flanged portion BM.

In this way, by taking into account the outer diameter of the dummy layer CTd above and below the step, more accurate analysis becomes possible, and the existence of the flanged portion BM can be checked.

The third point to note is the difference between the outer diameter of the columnar portion HR extending in the insulating layer 51 covering an upper part of the staircase portion SP and the outer diameter of the columnar portion HR extending in the staircase portion SP. That is, the diameter of the columnar portion HR in a layer such as the word line WL of the uppermost layer of the staircase portion SP on which the columnar portion HR is disposed is compared with the diameter of the columnar portion HR in the insulating layer 51 immediately above the uppermost layer of the staircase portion SP.

Here, the insulating layer 51 disposed above the staircase region SR is also, for example, a silicon oxide layer or the like, similarly to the dummy layer BKd, the flanged portion BM, and the insulating layer OL. However, unlike the dummy layer BKd, the flanged portion BM, and the insulating layer OL, the insulating layer 51 is a denser silicon oxide layer made of, for example, densified tetraethyl orthosilicate (dTEOS) or the like. Therefore, for example, it is considered that the dummy layer BKd, which is an outermost layer of the columnar portion HR extending in the insulating layer 51, and the insulating layer 51 can be distinguished from each other by SEM or the like.

In the example of FIG. 4, in the depicted columnar portion HR, the insulating layer 45 has an outer diameter 45*b* at a height position of the word line WL of the uppermost layer penetrated by the columnar portion HR. The outer diameter 45*b* actually corresponds to the diameter of the outer edge portion of the flanged portion BM protruding toward the word line WL side of the uppermost layer.

Further, in the same columnar portion HR, the insulating layer 45 has an outer diameter 45*d* at a height position of a lower end portion of the insulating layer 51 above the word line WL of the uppermost layer. In the example of FIG. 4, the lower end portion of the insulating layer 51 is a part in contact with an upper surface of the word line WL of the uppermost layer through which the columnar portion HR penetrates. However, another insulating layer or the like may be interposed between the insulating layer 51 and the word line WL of the uppermost layer. In this case, the lower end portion of the insulating layer 51 can be a part where the insulating layer 51 is in contact with the upper surface of the other insulating layer.

Here, it is assumed that there is a virtual line VLb in which the outer edge portion of the insulating layer 45 at the height position of the lower end portion of the insulating layer 51 is extended to the height position of the word line WL of the uppermost layer below the outer edge portion of the insulating layer 45, that is, the position where the insulating layer 45 has the outer diameter 45*b*. In the example of FIG. 4, a region surrounded by the virtual line VLb has an outer diameter 45*dv* at the height position of the word line WL of the uppermost layer.

As described above, regardless of whether the columnar portion HR has a tapered shape, a bowing shape, or a substantially vertical shape, when the columnar portion HR has the flanged portion BM, the outer diameter 45*b* of the insulating layer 45 at the height position of the word line WL of the uppermost layer is larger than the outer diameter 45*dv* of the region surrounded by the virtual line VLb in which the outer edge portion of the insulating layer 45 at the height of the lower end portion of the insulating layer 51 is extended to the height position of the word line WL of the uppermost layer below the outer edge portion of the insulating layer 45.

In other words, when the columnar portion HR includes the flanged portion BM, the outer edge portion of the insulating layer 45 at the height position of the word line WL of the uppermost layer is positioned outside the region surrounded by the virtual line VLb in which the outer edge portion of the insulating layer 45 at the height of the lower end portion of the insulating layer 51 is extended to the height position of the word line WL of the uppermost layer below the outer edge portion of the insulating layer 45.

However, when simply comparing the outer diameter of the columnar portion HR in the insulating layer 51 with the outer diameter of the columnar portion HR in the staircase portion SP, the outer diameter 45*b* of the insulating layer 45 at the height position of the word line WL of the uppermost layer may be compared with the outer diameter 45*d* of the insulating layer 45 at the height position of the lower end portion of the insulating layer 51. When the columnar portion HR has the flanged portion BM, the outer diameter 45*b* of the insulating layer 45 is also larger than the outer diameter 45*d* of the insulating layer 45.

In other words, when the columnar portion HR has the flanged portion BM, the outer edge portion of the insulating layer 45 at the height position of the word line WL of the uppermost layer is positioned outside (beyond) the outer edge portion of the insulating layer 45 at the height position of the lower end portion of the insulating layer 51, when viewed from the stacking direction.

Method for Manufacturing Semiconductor Memory Device

Next, a method for manufacturing the semiconductor memory device 1 according to the embodiment will be described with reference to FIGS. 5A to 15C. FIGS. 5A to 15C are diagrams illustrating a part of a procedure of the method for manufacturing the semiconductor memory device 1 according to the embodiment in order. It is assumed that the peripheral circuit CUA is formed on the substrate SB and the insulating layer 50 covering the peripheral circuit CUA is formed before processing illustrated in FIGS. 5A to 15C.

Figure 5A:
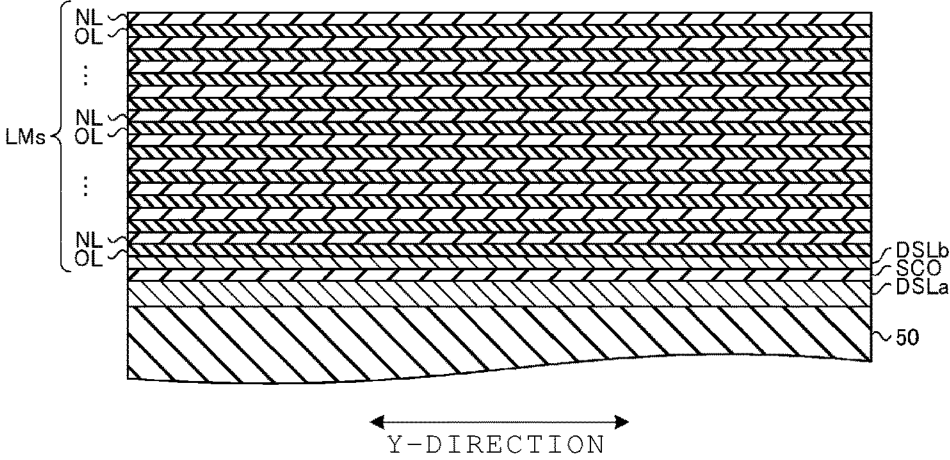
FIGS. 5A to 5C are diagrams illustrating aspects of a method for manufacturing a semiconductor memory device according to an embodiment.
Figure 5B:
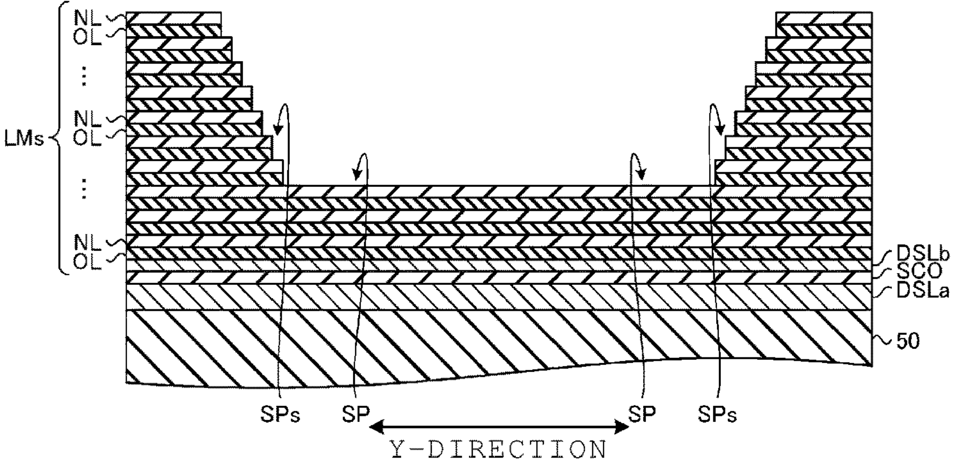
Figure 5C:
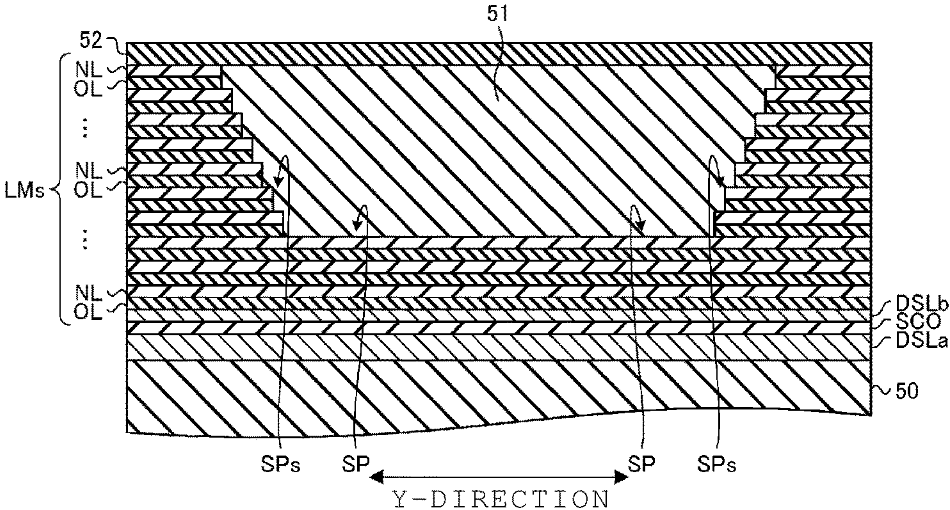

First, FIGS. 5A to 5C illustrate how the staircase portion SP is formed. FIGS. 5A to 5C illustrate cross sections along the Y-direction of a region that later becomes the staircase region SR.

As illustrated in FIG. 5A, the lower source line DSLa, the intermediate insulating layer SCO, and the upper source line DSLb are formed on the insulating layer 50 in this order. The lower source line DSLa and the upper source line DSLb are, for example, a polysilicon layer or the like. The intermediate insulating layer SCO is, for example, a silicon oxide layer or the like.

Further, on the upper source line DSLb, a stacked body LMs in which the plurality of insulating layers NL and the plurality of insulating layers OL are alternately stacked one by one is formed. The insulating layers NL are, for example, a silicon nitride layer or the like, and function as sacrificial layers which are later replaced with a conductive material to become the word lines WL and the select gate lines SGD and SGS.

As illustrated in FIG. 5B, in a partial region of the stacked body LMs, the insulating layer NL and the insulating layer OL are recessed in the staircase shape to form the staircase portion SP. The staircase portion SP is formed by repeating slimming of a mask pattern such as a photoresist layer and etching of the insulating layers NL and the insulating layers OL of the stacked body LMs a plurality of times.

That is, a mask pattern having an opening at a position where the staircase portion SP is formed is formed on an upper surface of the stacked body LMs, and for example, the insulating layers NL and the insulating layers OL are etched and removed one by one. Further, by processing with oxygen plasma or the like, an end portion of the mask pattern of the opening is retracted to widen the opening, and the insulating layers NL and the insulating layers OL are further etched and removed one by one. By repeating such processing a plurality of times, the insulating layers NL and the insulating layers OL at the opening of the mask pattern are recessed in the staircase shape.

Each time the above processing is repeated a predetermined number of times, the mask pattern is newly formed so that a layer thickness of the mask pattern can be maintained at a predetermined level or higher. In this case, by adjusting a position of the opening of the mask pattern, a comparatively gently inclined staircase portion SP and steep dummy staircase portions SPf and SPs can be formed. Similarly, by adjusting positions of end portions of the mask pattern at both end portions in the X-direction and both end portions in the Y-direction of the stacked body LMs, steep dummy staircase portions are formed at four end portions of the stacked body LMs, similar to the steep dummy staircase portions SPf and SPs.

The cross section illustrated in FIG. 5B represents the third stair from the lowermost stair of the staircase portion SP thus formed, and is separated into two staircase portions SP by the plate-shaped contact LI formed later. Further, the staircase portion SPs is formed on one side of the stacked body LMs of each staircase portion SP in the Y-direction.

As illustrated in FIG. 5C, the insulating layer 51 such as a silicon oxide layer that covers the staircase portion SP and reaches the height of the upper surface of the stacked body LMs is formed. That is, the insulating layer 51 is formed in a bowl-shaped region surrounded by the staircase portions SP, SPs, and SPf. The insulating layer 51 is also formed in a peripheral region of the stacked body LMs including a staircase portion at each of four end portions.

Further, the insulating layer 52 that covers the upper surface of the stacked body LMs and the upper surface of the insulating layer 51 is further formed thereon.

Next, FIGS. 6A to 8B illustrate how the flanged portion BM of the columnar portion HR is formed.

FIGS. 6A to 60 and FIGS. 8A and 8B illustrate cross sections along the Y-direction of the staircase region SR, similarly to FIGS. 5A to 5C. In FIGS. 6A to 6C and FIGS. 8A and 8B, for convenience of explanation, the state of the pillar PL formed in parallel with the columnar portion HR is also illustrated. FIGS. 6A to 6C and FIGS. 8A and 8B do not mean that the columnar portion HR and the pillar PL are disposed together in the same cross section along the Y-direction.

Figure 6A:
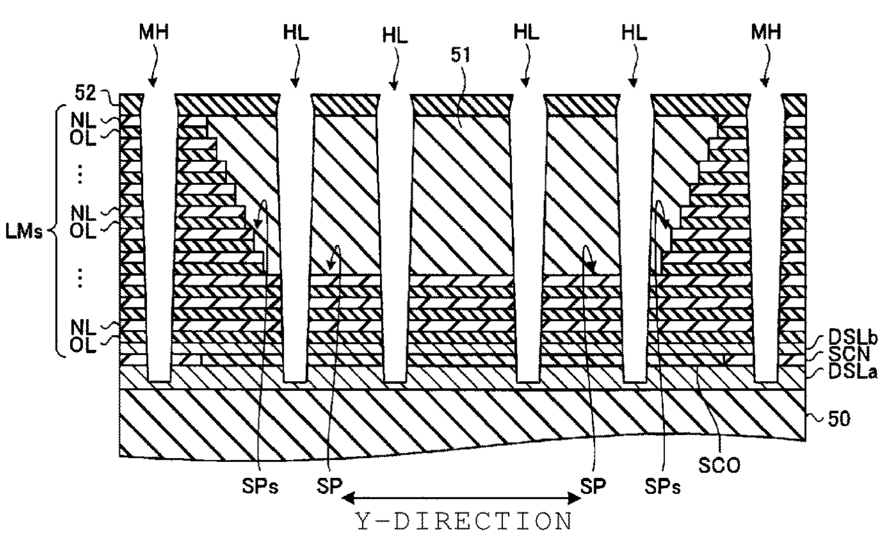
FIGS. 6A to 6C are diagrams illustrating aspects of a method for manufacturing a semiconductor memory device according to an embodiment.

As illustrated in FIG. 6A, in the bowl-shaped region surrounded by the staircase portions SP, SPs, and SPf, a plurality of holes HL that penetrate the insulating layers 52 and 51, the stacked body LMs, the upper source line DSLb, and the intermediate insulating layer SCO, and reach the lower source line DSLa are formed.

The plurality of holes HL may have, for example, a tapered shape or a bowing shape. Further, when a lower end portion of the hole HL reaches the upper source line DSLb, which is a polysilicon layer or the like, from the stacked body LMs in which the insulating layers NL and OL are stacked, a step may be formed on a side wall of the hole HL between the insulating layer OL of a lowermost layer of the stacked body LMs and the upper source line DSLb of a lower layer of the insulating layer OL due to a shape of the hole HL becoming more tapered or the like.

Furthermore, in parallel with a formation of the plurality of holes HL, a plurality of memory holes MH that penetrate the insulating layer 52, the stacked body LMs, the upper source line DSLb, and the intermediate sacrificial layer SCN and reach the lower source line DSLa are formed in a region that becomes the memory region MR at positions away from the staircase portions SP, SPs, and SPf in the X-direction.

The plurality of memory holes MH may have, for example, a tapered shape or a bowing shape. Further, when a lower end portion of the memory hole MH reaches the upper source line DSLb, which is a polysilicon layer or the like, from the stacked body LMs in which the insulating layers NL and OL are stacked, a step may be formed on a side wall of the memory hole MH between the insulating layer OL of the lowermost layer of the stacked body LMs and the upper source line DSLb of the lower layer of the insulating layer OL due to a shape of the memory hole MH becoming more tapered or the like.

Figure 6B:
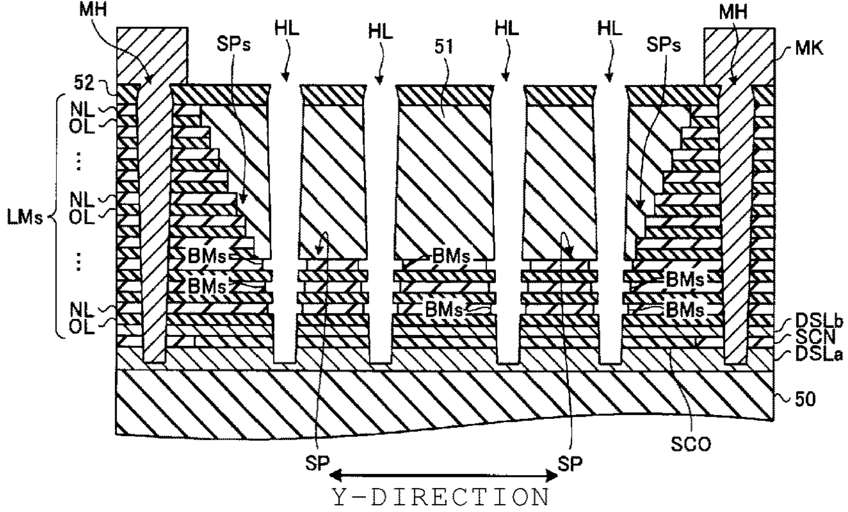

As illustrated in FIG. 6B, a mask layer MK such as a photoresist layer is formed on the insulating layer 52 in a region excepting the staircase portions SP, SPs, and SPf and an end portion of the stacked body LMs. With this configuration, the memory hole MH is covered by the mask layer MK in the regions that becomes the memory region(s) MR. In this case, the mask layer MK may be partially or wholly filled into the memory holes MH.

Furthermore, a part exposed from the mask layer MK is treated with a removing liquid (etchant) such as hot phosphoric acid that dissolves a silicon nitride layer such as the insulating layer NL.

The removing liquid flows into the hole HL, and an exposed surface of the insulating layer NL of the stacked body LMs exposed in the hole HL is dissolved by the removing liquid. In this case, the exposed surface in the hole HL of the insulating layer OL of the stacked body LMs is not dissolved by the removing liquid.

Therefore, the insulating layer NL recedes exclusively from a side surface of the hole HL toward the outside, and at the height positions of the plurality of insulating layers NL, a plurality of flanged portions BMs protruding from an original side surface of the hole HL toward a side of the plurality of insulating layers NL are formed. In this case, the exposed surface in the hole HL of the insulating layer 51 that covers the staircase portion SP and the like is also not dissolved by the removing liquid. Therefore, the flanged portions BMs are not formed on the side surface of the hole HL extending in the insulating layer 51 in the stacking direction.

As described above, for example, since a part of the insulating layer NL of the stacked body LMs is removed by wet treatment using the removing liquid, the insulating layer NL is isotropically removed from the side surface of the hole HL toward the outside. Therefore, the plurality of flanged portions BMs widen substantially concentrically from the side surface of the hole HL.

Figure 6C:
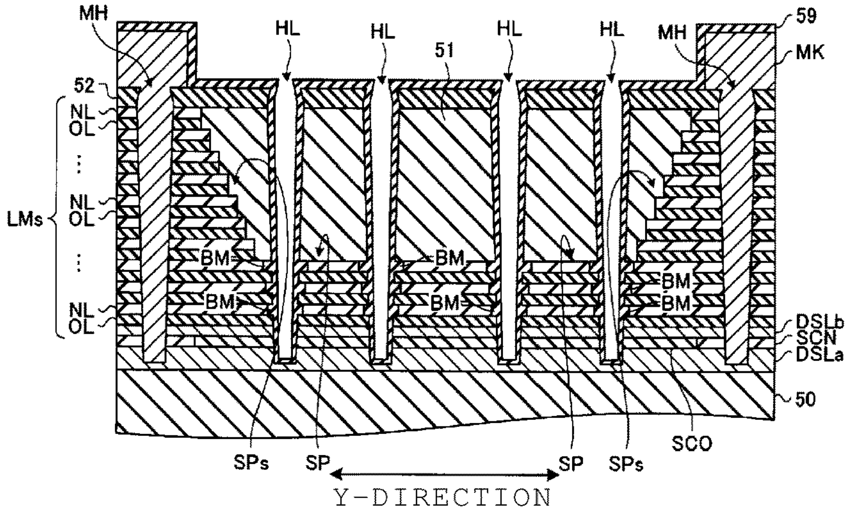

As illustrated in FIG. 6C, the insulating layer 59 such as a silicon oxide layer covering the entire stacked body LMs is formed. With this configuration, the insulating layer 59 is formed on the insulating layer 52 of the part exposed from the mask layer MK, and the side surfaces and the bottom surface of the hole HL are also covered with the insulating layer 59. In this case, the inside of the flanged portion BMs on the side surface of the hole HL is filled with the insulating layer 59, and a plurality of flanged portions BM are formed.

Further, in the part covered with the mask layer MK, the insulating layer 59 is formed on an upper surface of the mask layer MK, and a side surface of the mask layer MK facing the opening is also covered with the insulating layer 59.

FIGS. 7A and 7B illustrate a more detailed state in which the insulating layer 59 is filled in the flanged portion BMs. FIGS. 7A and 7B are partially enlarged views of a cross section of the hole HL.

As illustrated in FIG. 7A, when the insulating layer 59 is formed in the hole HL, the insulating layer 59 is deposited on the side wall of the hole HL, and is also deposited on the upper and lower surfaces of the insulating layer OL exposed in the flanged portion BMs of the side wall of the hole HL and end surfaces of the insulating layer NL.

In this case, for example, a deposition rate of the insulating layer 59 is faster in the vicinity of an inlet of the flanged portion BMs opened toward an inside of the hole HL than in the vicinity of an inner side of the flanged portion BMs. This is because the raw material gas concentration of the insulating layer 59 is higher in the vicinity of the inlet of the flanged portion BMs, and the components of the insulating layer 59 in raw material gas are more likely to be deposited when the components come into contact with end portions of the insulating layer OL protruding above and below the inlet of the flanged portion BMs.

As illustrated in FIG. 7B, as a result of the matters described above, before the inside of the flanged portion BMs is completely filled with the insulating layer 59, for example, the inlet of the flanged portion BMs opened toward the inside of the hole HL may be blocked. With this configuration, the flanged portion BM with void HRv inside may be formed.

After the flanged portion BM is formed as described above, the insulating layer 59 in an unnecessary part is removed as described below.

As illustrated in FIG. 8A, the insulating layer 59 is removed from an upper surface of the insulating layer 52 in the part exposed from the mask layer MK, the side surface and the bottom surface of the hole HL, and the upper surface and the side surface of the mask layer MK.

In this case, the insulating layer 59 in the flanged portion BM of the side wall of the hole HL is not removed, and some insulating layer 59 may remain on the side surface and the bottom surface of the hole HL. On the other hand, it is preferable to remove the insulating layer 59 substantially completely from the upper surface of the mask layer MK and the side surface of the mask layer MK facing the opening.

As illustrated in FIG. 8B, ashing using oxygen plasma or the like is performed to remove the mask layer MK from a region where the memory hole MH is formed and the inside of the memory hole MH. By removing the insulating layer 59 from the surface of the mask layer MK substantially completely by the processing of FIG. 8A described above, when the mask layer MK is removed, the insulating layer 59 remaining on the mask layer MK is prevented from becoming a particle source.

Next, FIG. 9A to FIG. 11B illustrate how the pillar PL and the columnar portion HR are formed.

Figure 9A:
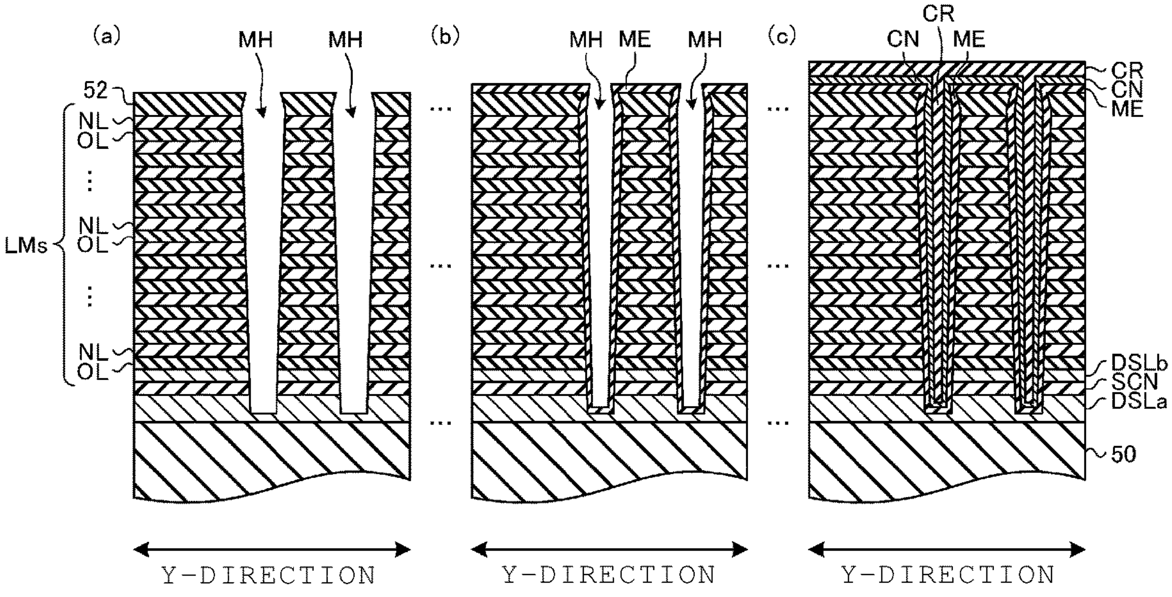
FIGS. 9A and 9B are diagrams illustrating aspects of a method for manufacturing a semiconductor memory device according to an embodiment.
Figure 9B:
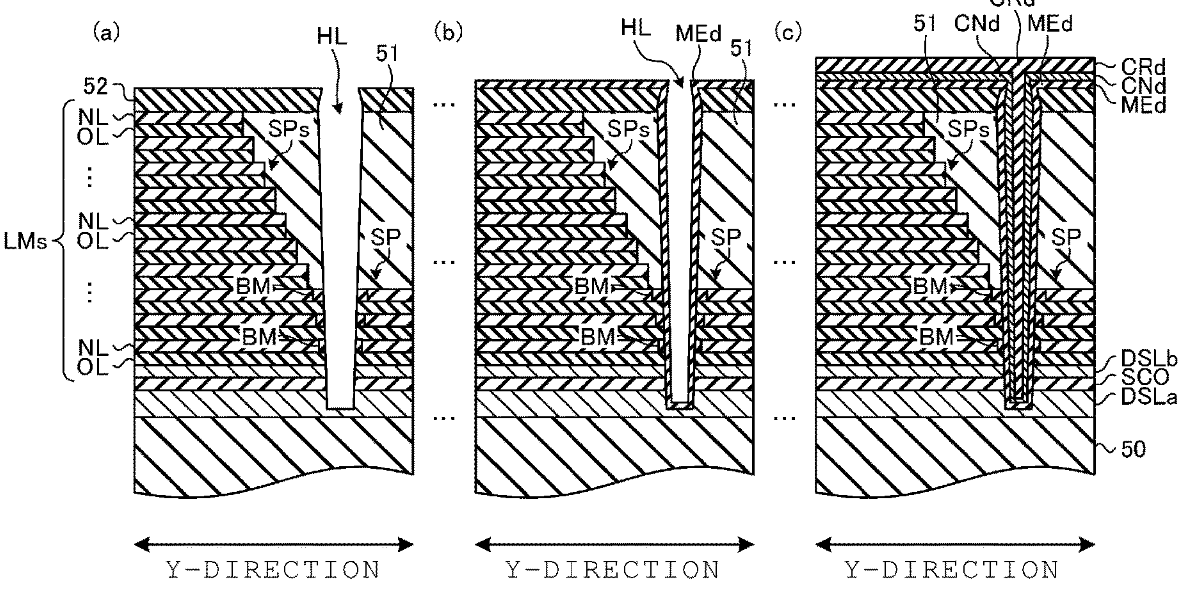
Figure 10A:
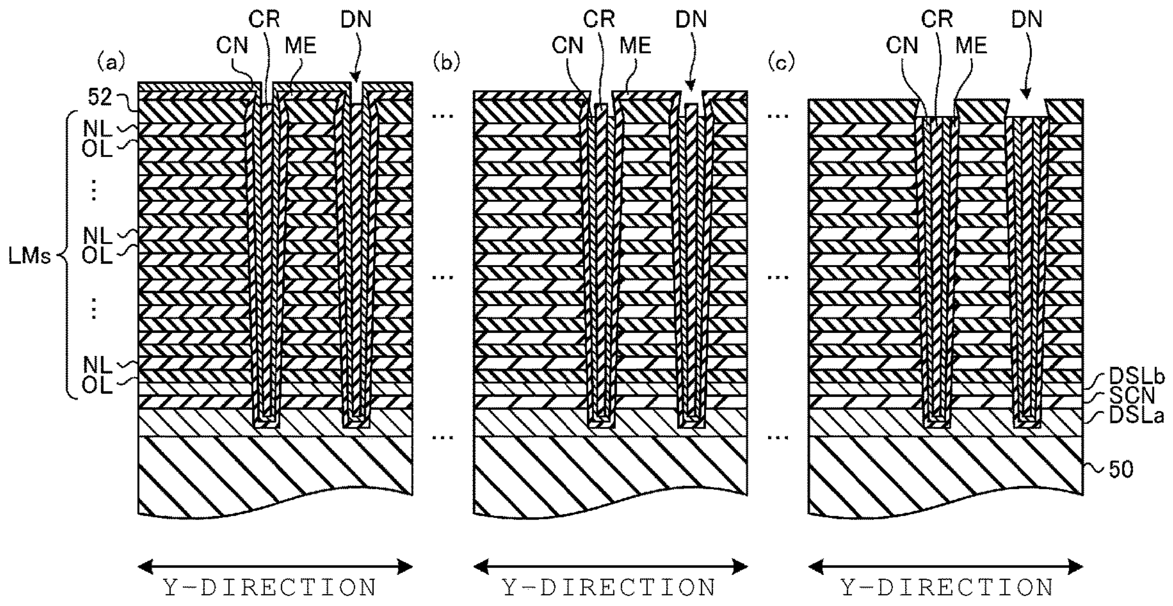
FIGS. 10A and 10B are diagrams illustrating aspects of a method for manufacturing a semiconductor memory device according to an embodiment.
Figure 10B:
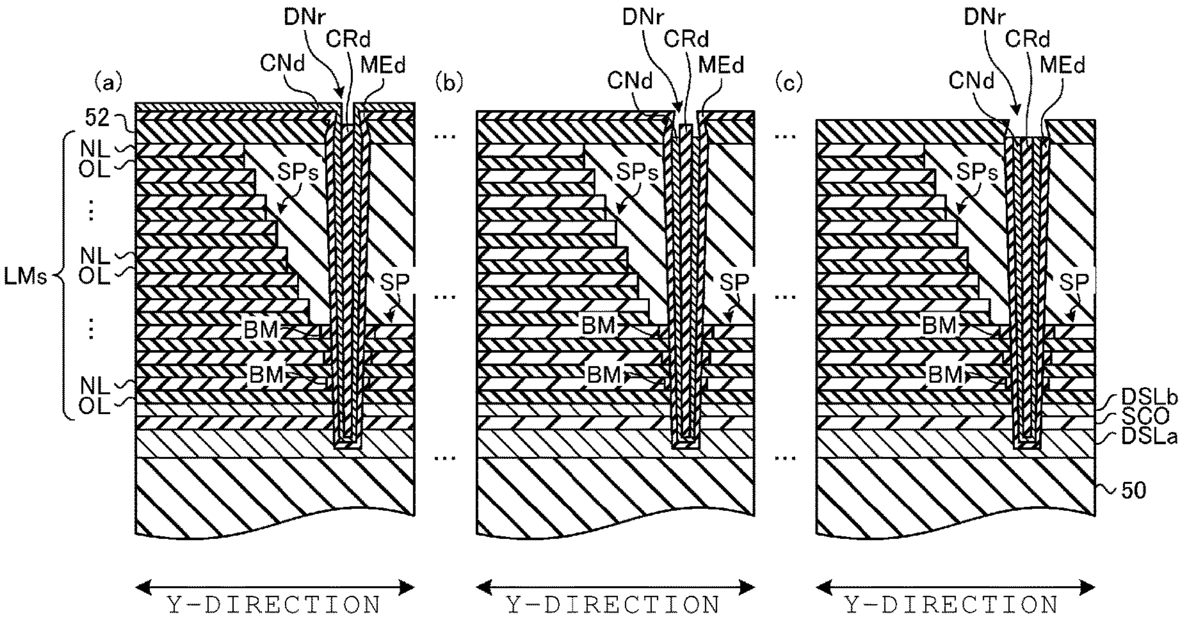
Figure 11A:
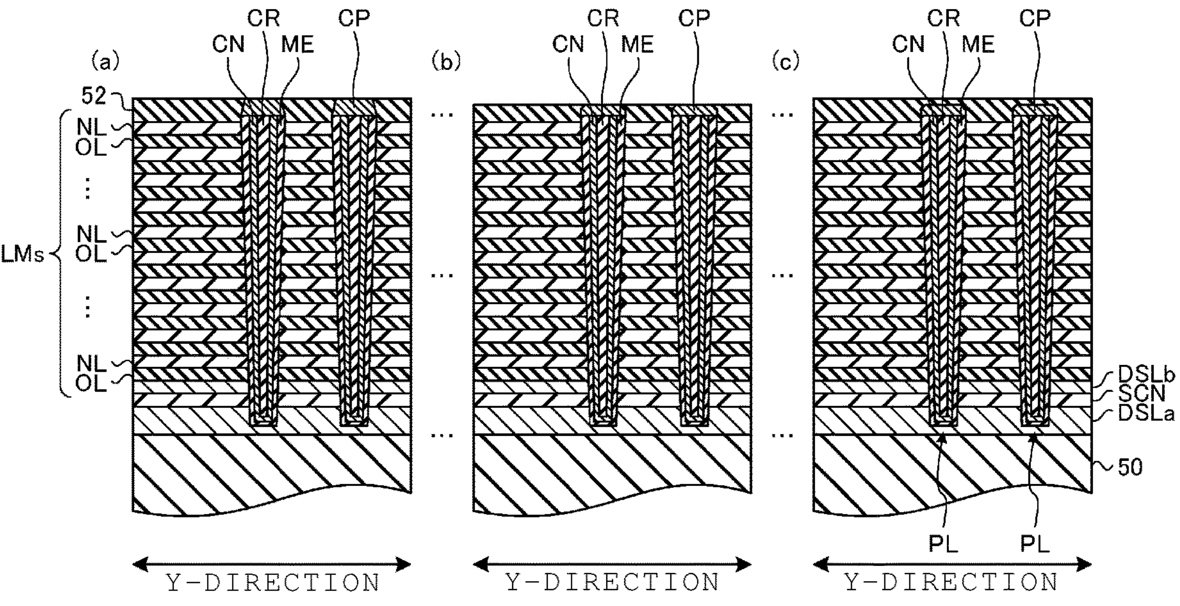
FIGS. 11A and 11B are diagrams illustrating aspects of a method for manufacturing a semiconductor memory device according to an embodiment.
Figure 11B:
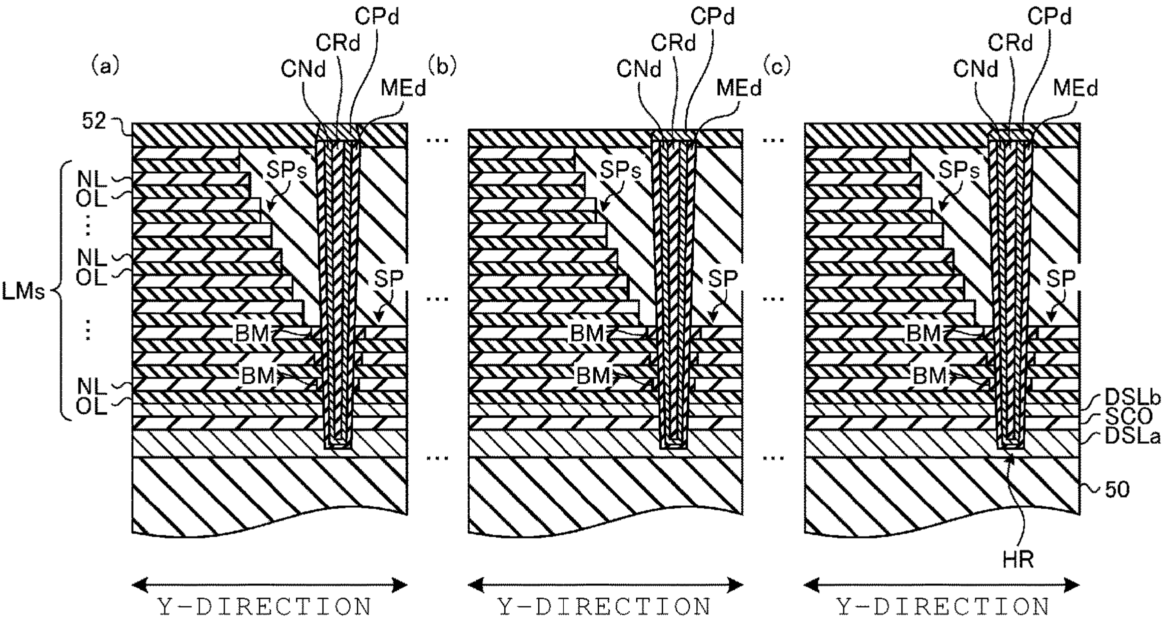

The FIG. 9A to FIG. 11B illustrate cross sections along the Y-direction of a region that later becomes the memory region MR, and cross sections along the Y-direction of a region including the staircase portion SP. That is, the parts (a) to the parts (c) in FIGS. 9A, 10A, and 11A are cross-sectional views along the Y-direction of the region that later becomes the memory region MR, and the parts (a) to the parts (c) in FIGS. 9B, 10B, and 11B illustrate processing corresponding to the parts (a) to the parts (c) in FIGS. 9A, 10A, and 11A in the cross sections along the Y-direction of the region including the staircase portion SP.

As illustrated in the part (a) in FIG. 9A, in the region that later becomes the memory region MR, the plurality of memory holes MH that penetrate the insulating layer 52, the stacked body LMs, the upper source line DSLb, and the intermediate sacrificial layer SCN and reach the lower source line DSLa are formed.

As illustrated in the part (b) in FIG. 9A, the memory layer ME, in which the block insulating layer BK, the charge storage layer CT, and the tunnel insulating layer TN are stacked in this order from an outer peripheral side of the memory hole MH, is formed in the memory hole MH. The memory layer ME is also formed on the upper surface of the insulating layer 52. As described above, the block insulating layer BK and the tunnel insulating layer TN are, for example, a silicon oxide layer or the like, and the charge storage layer CT is, for example, a silicon nitride layer or the like.

As illustrated in the part (c) in FIG. 9A, the channel layer CN such as a polysilicon layer or an amorphous silicon layer is formed in the memory layer ME. The channel layer CN is also formed on the upper surface of the insulating layer 52 via the memory layer ME.

Further, the core layer CR such as the silicon oxide layer is filled further in the channel layer CN. The core layer CR is also formed on the upper surface of the insulating layer 52 via the memory layer ME and the channel layer CN.

As described above, when the memory hole MH has a step on a side wall of a boundary part between the insulating layer OL of the lowermost layer and the upper source line DSLb of the lower layer of the insulating layer OL, the memory layer ME, the channel layer CN, and the core layer CR are formed along the step of the side wall of the memory hole MH. With this configuration, the memory layer ME, the channel layer CN, and the core layer CR may also have steps, respectively.

As illustrated in the part (a) in FIG. 9B, in the region that later becomes the staircase region SR, a plurality of holes HL that penetrate the insulating layers 52 and 51, the stacked body LMs, the upper source line DSLb, and the intermediate insulating layer SCO, reach the lower source line DSLa, and includes the plurality of flanged portions BM on a side wall within the stacked body LMs are formed.

As illustrated in the part (b) in FIG. 9B, in parallel with the above processing of the part (b) in FIG. 9A for the memory hole MH, the dummy layer MEd, in which the dummy layers BKd, CTd, and TNd are stacked is formed in the hole HL of the staircase portion SP in order from an outer peripheral side of the hole HL. The dummy layer MEd is also formed on the upper surface of the insulating layer 52.

As illustrated in the part (c) in FIG. 9B, in parallel with the above processing of the part (c) in FIG. 9A for the memory hole MH, the dummy layer CNd such as a polysilicon layer or an amorphous silicon layer is formed in the dummy layer MEd. The dummy layer CNd is also formed on the upper surface of the insulating layer 52 around the hole HL via the dummy layer MEd.

Further, the dummy layer CRd such as a silicon oxide layer is filled further in the dummy layer CNd. The dummy layer CRd is also formed on the upper surface of the insulating layer 52 around the hole HL via the dummy layers MEd and CNd.

As described above, when the hole HL has a step on the side wall of the boundary part between the insulating layer OL of the lowermost layer and the upper source line DSLb of the lower layer of the insulating layer OL, the dummy layers MEd, CNd, and CRd are formed along the step on the side wall of the hole HL. With this configuration, the dummy layers MEd, CNd, and CRd may also have steps, respectively.

As illustrated in the part (a) in FIG. 10A, the core layer CR on the upper surface of the insulating layer 52 and in the memory hole MH is etched back. In this case, by using the underlying channel layer CN as a stopper layer and etching the core layer CR while maintaining selectivity with the channel layer CN, the core layer CR part in the memory hole MH is depressed, and a recess DN is formed at an upper end portion of the memory hole MH. Further, the core layer CR on the upper surface of the insulating layer 52 is removed, and the channel layer CN is exposed.

As illustrated in the part (b) in FIG. 10A, the channel layer CN on the upper surface of the insulating layer 52 and in the memory hole MH is etched back. In this case, by using the underlying memory layer ME as a stopper layer and etching the channel layer CN while maintaining selectivity with the memory layer ME, the channel layer CN part in the memory hole MH recedes downward, and the recess DN at the upper end portion of the memory hole MH is expanded. An upper end portion of the core layer CR protrudes from a central portion of the recess DN. Further, the channel layer CN on the upper surface of the insulating layer 52 is removed, and the memory layer ME is exposed.

As illustrated in the part (c) in FIG. 10A, the memory layer ME on the upper surface of the insulating layer 52 and in the memory hole MH is etched back. In this case, an etching amount is adjusted so that the underlying insulating layer 52 is not removed. With this configuration, the memory layer ME part in the memory hole MH recedes downward, and the recess DN at the upper end portion of the memory hole MH is further expanded. The upper end portion of the core layer CR protruding from the central portion of the recess DN is also removed, and a bottom surface of the recess DN becomes substantially flat. Further, the memory layer ME on the insulating layer 52 is removed, and the insulating layer 52 is exposed.

The processing from the part (a) in FIG. 10A to the part (c) in FIG. 10A is controlled so that the bottom surface of the recess DN stays at the height position in the insulating layer 52 and does not reach the insulating layer NL of the uppermost layer after processing of the part (c) in FIG. 10A.

As illustrated in the part (a) in FIG. 10B, by the above processing of the part (a) in FIG. 10A for the memory hole MH, in the staircase portion SP, the dummy layer CRd on the upper surface of the insulating layer 52 around the hole HL and in the hole HL is etched back, and a recess DNr is formed at an upper end portion of the hole HL. Further, the dummy layer CRd on the upper surface of the insulating layer 52 is removed, and the dummy layer CNd is exposed.

As illustrated in the part (b) in FIG. 10B, by the above processing of the part (b) in FIG. 10A for the memory hole MH, the dummy layer CNd on the upper surface of the insulating layer 52 around the hole HL and in the hole HL is etched back, and the recess DNr at the upper end portion of the hole HL is expanded. An upper end portion of the dummy layer CRd protrudes from a central portion of the recess DNr. Further, the dummy layer CNd on the upper surface of the insulating layer 52 is removed, and the dummy layer MEd is exposed.

As illustrated in the part (c) in FIG. 10B, by the above processing of the part (c) in FIG. 10A for the memory hole MH, the dummy layer MEd on the upper surface of the insulating layer 52 around the hole HL and in the hole HL is etched back, and the recess DNr at the upper end portion of the hole HL is further expanded. The upper end portion of the dummy layer CRd protruding from the center of the recess DNr is also removed, and a bottom surface of the recess DNr becomes substantially flat. Further, the dummy layer MEd on the insulating layer 52 is removed, and the insulating layer 52 is exposed.

As illustrated in the parts (a) in FIGS. 11A and 11B, the insides of the recesses DN and DNr are filled with a polysilicon layer, an amorphous silicon layer, or the like to form the cap layer CP and the dummy layer CPd, respectively. With this configuration, the pillar PL is formed in the region that later becomes the memory region MR. Further, the columnar portion HR is formed in the region or the like that becomes the staircase region SR.

However, at this stage, the channel layer CN of the pillar PL is entirely covered with the memory layer ME, and is not connected to the intermediate sacrificial layer SCN that later becomes the intermediate source line BSL.

As illustrated in the parts (b) in FIGS. 11A and 11B, the insulating layer 52 is etched back together with the upper surfaces of the cap layer CP and the dummy layer CPd. With this configuration, the thickness of the insulating layer 52, the cap layer CP, and the dummy layer CPd is reduced.

As illustrated in the parts (c) in FIGS. 11A and 11B, the insulating layer 52 thinned by etching back is stacked. With this configuration, the upper surfaces of the cap layer CP and the dummy layer CPd are covered with the insulating layer 52.

Further, by the processing of the parts (b) in FIGS. 11A and 11B, and the parts (c) in FIGS. 11A and 11B, the upper surface of the columnar portion HR formed in the region or the like that become the staircase region SR is etched back and further covered with the insulating layer 52.

The processing illustrated in FIGS. 6A to 8B and the processing illustrated in the parts (a) to the parts (c) in FIGS. 9B, 10B, and 11B are also performed, for example, in the penetration contact region TP described above and the dummy staircase portion at the four end portions of the stacked body LMs. With this configuration, the columnar portion HR is also formed in the penetration contact region TP and the dummy staircase portion at the end portion of the stacked body LMs.

However, the columnar portion HR has a dummy configuration that does not contribute to a function of the semiconductor memory device 1. Therefore, the columnar portion HR formed at the staircase region SR, the penetration contact region TP, and the end portion of the stacked body LMs may not have the dummy layer CPd. In this case, the processing of the part (a) in FIG. 11B can be skipped for the columnar portion HR, and the recess DNr of the columnar portion HR can be backfilled with, for example, the insulating layer 52.

Next, a FIG. 12A to FIG. 14B illustrate how the intermediate source line BSL and the word line WL are formed.

FIGS. 12A to 13C illustrate cross sections along the Y-direction of the region that later becomes the memory region MR, similar to the parts (a) to the parts (c) in FIGS. 9A, 10A, and 11A described above.

As illustrated in FIG. 12A, a slit ST that penetrates the insulating layer 52, the stacked body LMs, and the upper source line DSLb and reaches the intermediate sacrificial layer SCN is formed. The slit ST extends in the stacked body LMs in the direction along the X-direction. In this case, the slit ST may have a tapered shape or a bowing shape.

As illustrated in FIG. 12B, an insulating layer 55*p* is formed on side walls facing each other in the Y-direction of the slit ST.

In parallel with the processing of FIGS. 12A and 12B, in the penetration contact region TP, a contact hole that later becomes the penetration contact C4 and a slit that later becomes the plate-shaped portion BR may be formed.

That is, when the slit ST is formed in FIG. 12A, a contact hole that penetrates the insulating layer 52, the stacked body LMs, and the source line SL and reaches the insulating layer 50 is formed. Further, a slit that penetrates the insulating layer 52, the stacked body LMs, and the upper source line DSLb and reaches the intermediate insulating layer SCO so as to sandwich the contact hole from both sides in the Y-direction is formed.

Further, when the insulating layer 55*p* is formed on the side wall of the slit ST in FIG. 12B, an insulating layer is formed on the contact hole and the side wall and bottom surface of the slit. After that, a sacrificial layer such as an amorphous silicon layer or the like is filled further inside the insulating layer in the contact hole to protect the contact hole from the effects of the subsequent processing.

As illustrated in FIG. 12C, for example, a removing liquid such as hot phosphoric acid that dissolves a silicon nitride layer such as the intermediate sacrificial layer SCN is allowed to flow in, through the slit ST whose side wall is protected by the insulating layer 55*p*, to remove the intermediate sacrificial layer SCN interposed between the lower source line DSLa and the upper source line DSLb.

With this configuration, a gap layer GPs is formed between the lower source line DSLa and the upper source line DSLb. Further, the memory layer ME on an outer peripheral portion of the pillar PL is partially exposed in the gap layer GPs. In this case, since the side wall of the slit ST is protected by the insulating layer 55*p*, even the insulating layer NL in the stacked body LMs is prevented from being removed.

As illustrated in FIG. 13A, a chemical solution is appropriately flowed into the gap layer GPs through the slit ST to sequentially remove the block insulating layer BK, the charge storage layer CT, and the tunnel insulating layer TN exposed in the gap layer GPs. With this configuration, the memory layer ME is removed from a part of the side wall of the pillar PL, and a part of the inner channel layer CN is exposed in the gap layer GPs.

As illustrated in FIG. 13B, raw material gas such as amorphous silicon is injected from the slit ST whose side wall is protected by the insulating layer 55*p*, and the gap layer GPs is filled with amorphous silicon or the like. Further, the substrate SB is subjected to heat treatment to polycrystallize the amorphous silicon filled in the gap layer GPs to form the intermediate source line BSL containing polysilicon or the like.

With this configuration, the channel layer CN of the pillar PL is partially connected to the source line SL on the side surface via the intermediate source line BSL.

As illustrated in FIG. 13C, the insulating layer 55*p* on the side wall of the slit ST is temporarily removed.

It is preferable that the columnar portion HR, which has a dummy configuration, is not in electrical conduction with the source line SL. As described above, in the staircase region SR, the penetration contact region TP, and the like except for the memory region MR, the intermediate insulating layer SCO is disposed between the lower source line DSLa and the upper source line DSLb instead of the intermediate sacrificial layer SCN. Therefore, in processing of FIGS. 12A to 13C, in the staircase region SR, the penetration contact region TP, and the like, the intermediate sacrificial layer SCN is not removed, the dummy layer MEd of the columnar portion HR is not removed, and the intermediate source line BSL is not formed.

Figure 14A:
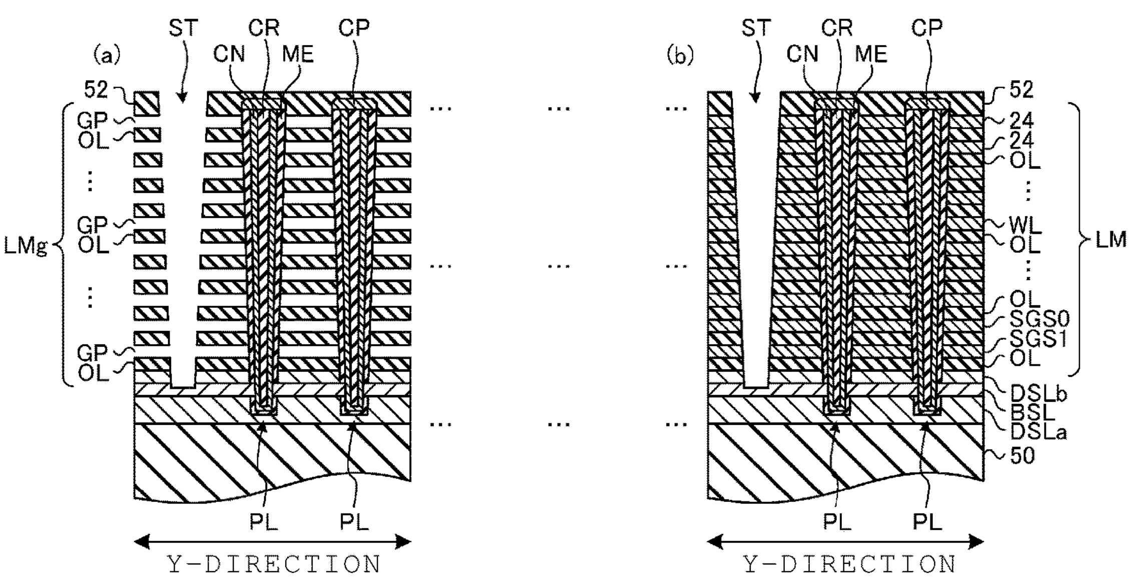
FIGS. 14A and 14B are diagrams illustrating aspects of a method for manufacturing a semiconductor memory device according to an embodiment.
Figure 14B:
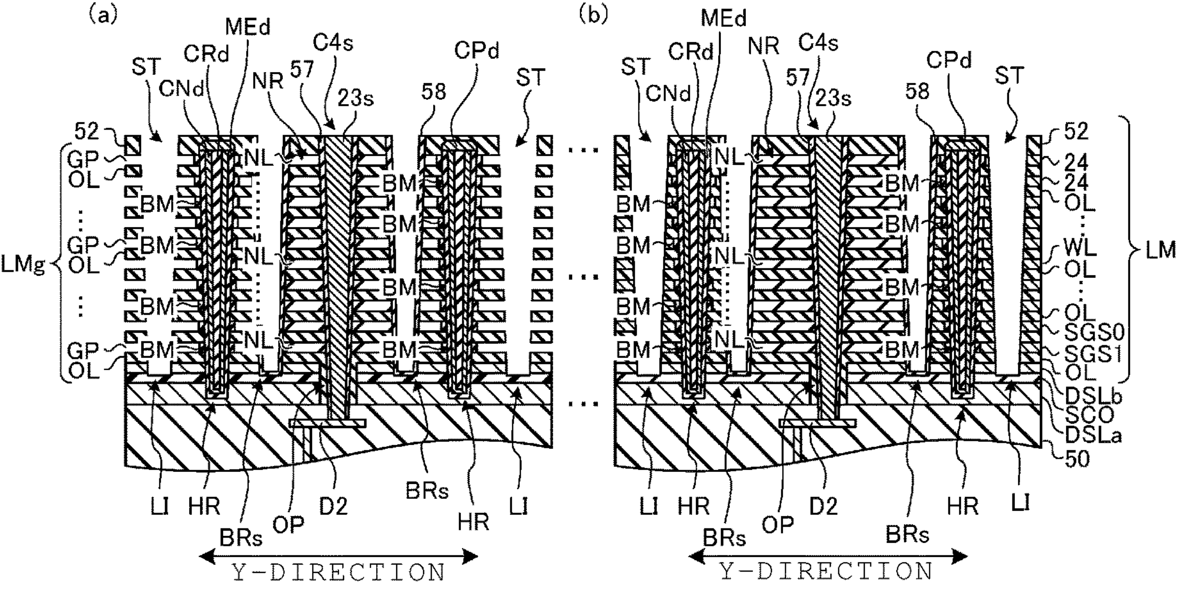

The part (a) in FIG. 14A to the part (b) in FIG. 14B illustrate cross sections along the Y-direction of the region that later becomes the memory region MR, and cross sections along the Y-direction of the region that later becomes the penetration contact region TP. That is, the parts (a) and (b) in FIG. 14A are cross-sectional views along the Y-direction of the region that later becomes the memory region MR, similar to FIGS. 12A to 13C described above. The parts (a) and (b) in FIG. 14B illustrate the processing corresponding to the parts (a) and (b) in FIG. 14A in the cross sections along the Y-direction of the region that later becomes the penetration contact region TP, respectively.

As illustrated in the part (a) in FIG. 14A, a removing liquid (etchant) such as hot phosphoric acid is allowed to flow into the stacked body LMs from the slit ST with the insulating layer 55*p* on the side wall removed to remove the insulating layer NL of the stacked body LMs. With this configuration, a stacked body LMg having a plurality of gap layers GP with the insulating layer NL between the insulating layers OL removed is formed.

As illustrated in the part (a) in FIG. 14B, in the region that later becomes the penetration contact region TP, a contact hole C4*s*, in which the insulating layer 57 is formed on the side wall and the bottom surface, and the inside of the insulating layer 57 is filled with a sacrificial layer 23*s*, is formed.

Further, the slit BRs, in which the contact hole C4*s* is interposed between both sides in the Y-direction and an insulating layer 58 is formed on the side wall and the bottom surface, is formed. Further, on the outside of these slits BRs in the Y-direction, the columnar portion HR including the plurality of flanged portions BM is formed over substantially the entire height direction.

Even in the region that becomes the penetration contact region TP in such a state, a part of the insulating layer NL is removed and the stacked body LMg including the plurality of gap layers GP is formed by the above processing in the region that becomes the memory region MR. However, the removing liquid of the insulating layer NL does not flow into the region in which the contact hole C4_s_ is formed because the slits BRs sandwiching the region from both sides in the Y direction block the region. Therefore, in the region, the insulating layer NL between the insulating layers OL is maintained.

The stacked body LMg including the plurality of gap layers GP has a fragile structure. In the memory region MR, the plurality of pillars PL support such a fragile stacked body LMg. In the staircase region SR and the penetration contact region TP, the plurality of columnar portions HR support the stacked body LMg. The plurality of columnar portions HR also support the stacked body LMg at the staircase portions at both end portions in the X-direction and both end portions in the Y-direction of the stacked body LMg.

With such a support structure of the pillar PL and the columnar portion HR, deflection of the remaining insulating layer OL, and distortion and collapse of the stacked body LMg are prevented. On the other hand, in the insulating portion NR which is interposed between the slits BRs and in which the insulating layer NL is not removed, the strength of the stacked body LMs is maintained even if the columnar portion HR is not disposed.

As illustrated in the parts (b) in FIGS. 14A and 14B, for example, raw material gas for conductive materials such as tungsten or molybdenum is injected from the slit ST into the stacked body LMg, and the gap layer GP of the stacked body LMg is filled with a conductive material to form the plurality of word lines WL. With this configuration, the stacked body LM in which the plurality of word lines WL and the plurality of insulating layers OL are alternately stacked one by one is formed. Further, the select gate lines SGS0 and SGS1 are formed in the lower layers of the word line WL of the lowermost layer via the insulating layers OL.

However, in the region where the insulating layer NL described above remains, the word line WL or the like is not formed, and the plurality of insulating layers NL and the plurality of insulating layers OL are alternately stacked to form the insulating portion NR.

As described above, the processing of forming the intermediate source line BSL from the intermediate sacrificial layer SCN and the processing of forming the word line WL or the like from the insulating layer NL are also referred to as replacement processing. In the replacement processing of forming the word line WL or the like, after removing the insulating layer NL of the stacked body LMs via slit ST, a layer containing a metal oxide such as aluminum oxide may be formed on the inner wall of the gap layer GP prior to filling the gap layer GP with the conductive material. In this case, the layer containing a metal oxide is formed on the upper and lower surfaces of the insulating layer OL in the stacking direction. Further, between the layer containing such a metal oxide and a conductive material such as tungsten or molybdenum, a layer containing barrier metal such as titanium, titanium nitride, tantalum, and tantalum nitride may be further interposed to prevent the diffusion of tungsten, molybdenum, and the like to other layers.

In the parts (b) in FIGS. 14A and 14B, a conductive layer 24 is formed on the upper layer of the word line WL of the uppermost layer via the insulating layer OL. The conductive layer 24 is partitioned into a pattern of the select gate line SGD by forming a separation layer SHE described below.

Figures 15A, 15B, 15C:
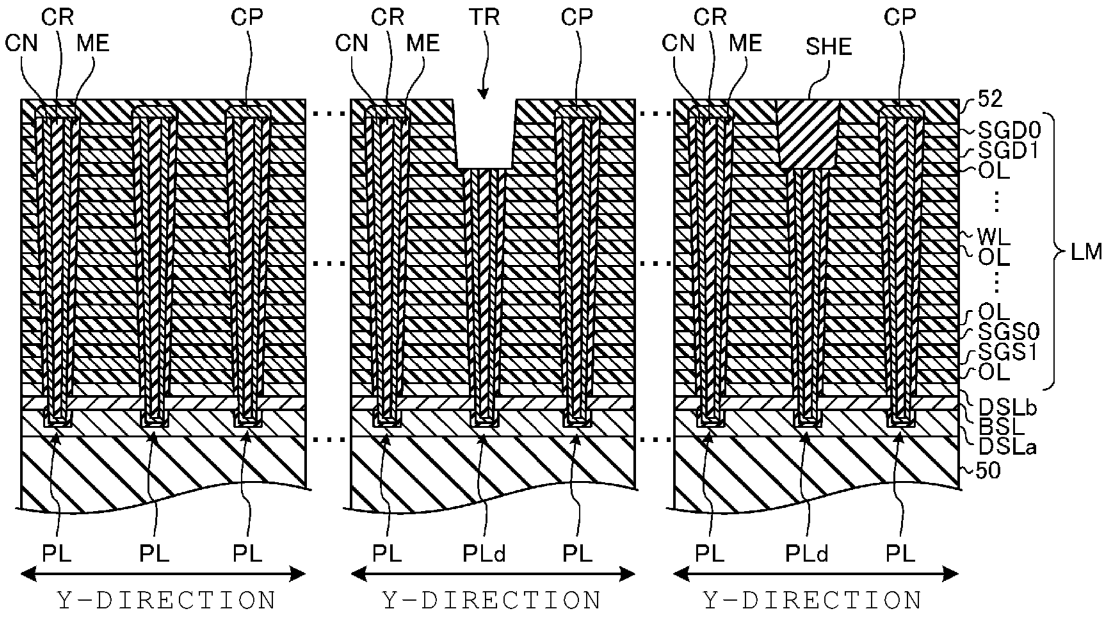
FIGS. 15A to 15C are diagrams illustrating aspects of a method for manufacturing a semiconductor memory device according to an embodiment.

FIGS. 15A to 15C illustrate how the separation layer SHE is formed.

FIGS. 15A to 15C illustrate cross sections along the Y-direction of the memory region MR different from those of the parts (a) and (b) in FIG. 14A.

As illustrated in FIG. 15A, in the processing so far, the plurality of pillars PL are formed in the memory region MR at a predetermined period.

As illustrated in FIG. 15B, a groove portion TR that penetrates the insulating layer 52 and the conductive layer 24 on the upper layer of the stacked body LM and extends in the stacked body LM in a direction substantially along the X-direction formed. Here, since the semiconductor memory device 1 according to the embodiment has two select gate lines SGD0 and SGD1, the groove portion TR penetrates the uppermost layer and a second conductive layer 24 from the uppermost layer, and reaches the insulating layer OL immediately under the second conductive layer 24.

Further, in the example illustrated in FIG. 15B, the groove portion TR is formed directly above one of the plurality of pillars PL located at a predetermined period. This is because when forming the plurality of pillars PL, the pillars PL may be disposed at the positions where the separation layer SHE is formed so that the periodicity of the pillar PL arrangement is maintained.

In this case, a part or all of the upper structure of the pillar PL is lost due to the groove portion TR, and a valid memory cell MC is not formed in such a pillar PL. Therefore, the pillar PL in which the groove portion TR is formed becomes a dummy pillar PLd that does not contribute to a function of the semiconductor memory device 1.

As illustrated in FIG. 15C, the inside of the groove portion TR is filled with an insulating layer such as a silicon oxide layer. With this configuration, the separation layer SHE is formed, and the conductive layer 24 on the upper layer of the word line WL is partitioned into the patterns of the select gate lines SGD0 and SGD1.

After that, the contact CC is formed in the staircase region SR. That is, a plurality of contact holes that penetrate the insulating layers 52 and 51 and reach the word line WL and the select gate lines SGD and SGS configuring each stair of the staircase portion SP, and the select gate line SGD of the staircase portion SPf, respectively, are collectively formed, and the insulating layer 56 and the conductive layer 22 (see FIG. 2A) are formed in the contact hole.

Further, after forming the contacts CC in the staircase portions SP and SPf, or prior to the formation of the contact CC, the penetration contact C4 is formed in the penetration contact region TP. That is, the sacrificial layer 23_s_ in the contact hole C4_s_ and the insulating layer 57 on the bottom surface of the contact hole C4_s_ are removed, and the conductive layer 23 (see FIG. 2B) is filled in the insulating layer 57 on the side wall of the contact hole C4_s_. With this configuration, the penetration contact C4 connected to the peripheral circuit CUA via the lower layer wiring D2 in the insulating layer 50 is formed.

Further, the plate-shaped contact LI that becomes a source line contact is formed before or after the formation of the penetration contact C4, or in parallel with the formation of the penetration contact C4. That is, the insulating layer 55 is formed on the side wall of the slit ST, and the conductive layer 21 is filled in the insulating layer 55. However, the insulating layer 55 or the like may be filled in the slit ST without forming the conductive layer 21, and a plate-shaped member having no function as a source line contact may be formed.

Further, the insulating layer 53 is formed on the insulating layer 52, and the plug V0 that penetrates the insulating layer 53 and is connected to the plate-shaped contact LI, the penetration contact C4, and the contact CC, respectively, is formed. The plug CH that penetrates the insulating layers 53 and 52 and is connected to the pillar PL is formed. The insulating layer 54 is formed on the insulating layer 53, and the upper layer wiring MX, the bit line BL, and the like connected to the plugs V0 and CH, respectively, are formed.

For example, by using a dual damascene method or the like, the plugs V0 and CH, the upper layer wiring MX, the bit line BL, and the like may be formed in the same process.

As described above, the semiconductor memory device 1 according to the embodiment is manufactured.

Overview

In the manufacturing process of a semiconductor memory device such as a three-dimensional nonvolatile memory, the sacrificial layer in the stacked body may be replaced with a conductive layer to form a stacked body in which the conductive layer and the insulating layer are stacked. In this case, in order to support a fragile stacked body including a plurality of gap layers during replacement processing, a columnar portion may be disposed in a region other than the memory region, for example. The columnar portion has a structure in which, for example, an insulating layer such as a silicon oxide layer is filled in a hole penetrating the stacked body.

However, when the columnar portion is composed of the insulating layer or the like, the insulating layer configuring the columnar portion may shrink due to thermal treatment(s) in the subsequent manufacturing process. Further, due to the shrinkage of the plurality of columnar portions, the entire region in which these columnar portions are disposed may sink in the stacking direction of the stacked body as compared with other regions such as the memory region. That is, the upper surface of the semiconductor memory device in the middle of manufacturing has uneven portions.

In the region where such sinking occurs, in processing using a lithography technique, the intended patterning target may not be met and a normal exposure may not be performed. Furthermore, in processing such as a polishing or a removing of a metal material embedded in a hole, a groove or the like from the upper surface of a stacked body, and the like, a polishing residue of the metal material or the like may be generated or left in a region where sinking occurs.

Therefore, it is conceivable that the columnar portion is comprised of a hard material having a higher Young's modulus than, for example, that of a silicon oxide layer. In this case, if the layer structure of the columnar portion is unified with the layer structure of the pillar including the channel layer or the like having a high Young's modulus, the columnar portion and the pillar can be formed collectively and easily.

However, in the manufacturing process of the semiconductor memory device, the columnar portion and the plate-shaped contact may be formed in contact with each other in some instances. With such contact, the columnar portion and the plate-shaped contact may have a tapered shape or a bowing shape, so that the distance between the columnar portion and the plate-shaped contact may be narrowed, or a positional deviation may occur during the formation of the columnar portion and the plate-shaped contact.

When the columnar portion has the same layer structure as the pillar, the contact with the plate-shaped contact may generate another problem such as described below.

For example, as the charge storage layer of the pillar, a nitride layer may be used similarly as in the sacrificial layer to be subjected to replacement processing when forming a stacked body including a plurality of conductive layers. When the slit and the columnar portion are in contact with each other, for example, if the nitride layer of the columnar portion is exposed in the slit and the replacement processing is performed through the slit, even the nitride layer of the columnar portion is replaced with the conductive layer through the exposed part, and there is a possibility that the breakdown voltage will be insufficient between certain ones of the plurality of word lines.

However, according to the semiconductor memory device 1 according to the present embodiment, the columnar portion HR includes the dummy layer BKd that covers a side wall of the dummy layer CTd and includes a plurality of flanged portions BM, which protrude toward the side of the plurality of word line WL and the select gate lines SGD and SGS on a side wall thereof, at the height positions of the plurality of word line WL and the select gate lines SGD and SGS.

With this configuration, even if the arrangement density of the columnar portion HR is reduced to widen the pitch, or the cross-sectional area of the columnar portion HR (excepting for the flanged portions BM) along the XY plane is reduced, the stacked body LMg can still be sufficiently supported by the plurality of flanged portions BM widening from the side wall of the columnar portion HR to the periphery. Therefore, deflection of the insulating layer OL in the stacked body LMg and distortion and collapse of the stacked body LMg are prevented.

On the other hand, by widening the pitch of the columnar portions HR or reducing a cross-sectional area of the columnar portions HR, the risk of contact between a columnar portion HR and a plate-shaped contact LI can be reduced. With this configuration, the dummy layer CTd of the columnar portion HR can be prevented from being exposed in the slit ST and thus prevented from being replaced by the conductive layer, and the breakdown voltage among the plurality of word lines WL can be maintained.

Other Modifications

Figure 16A:
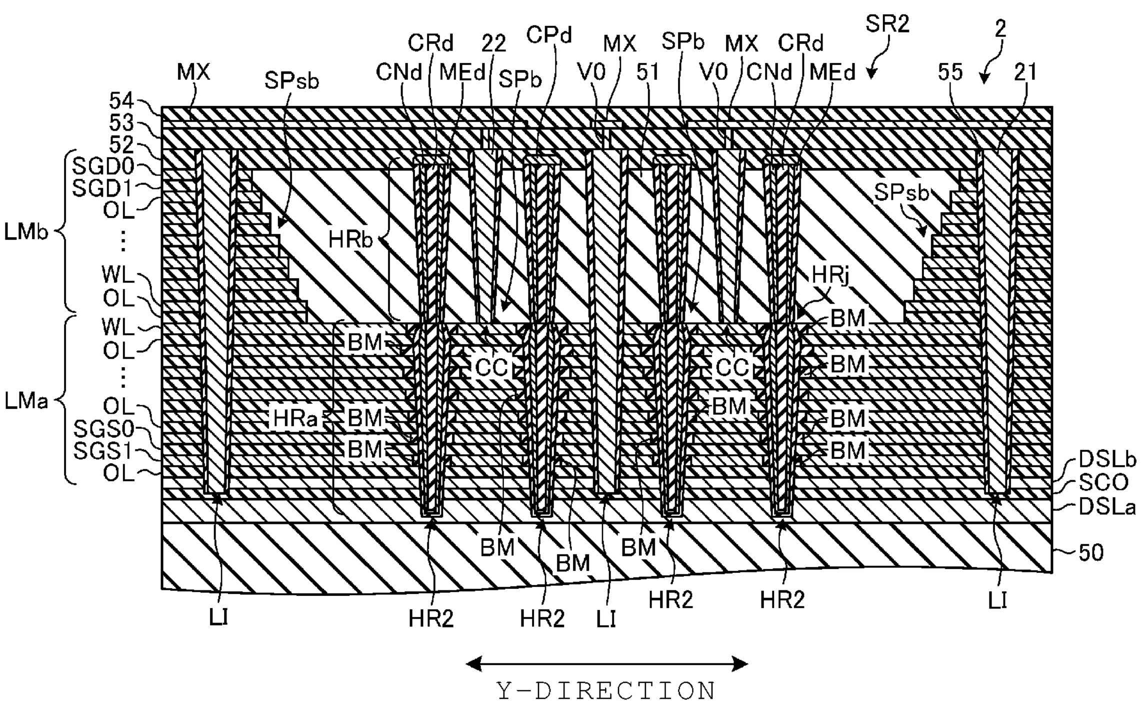
FIGS. 16A and 16B are cross-sectional views of a staircase region of a semiconductor memory device according certain modifications of an embodiment.
Figure 16B:
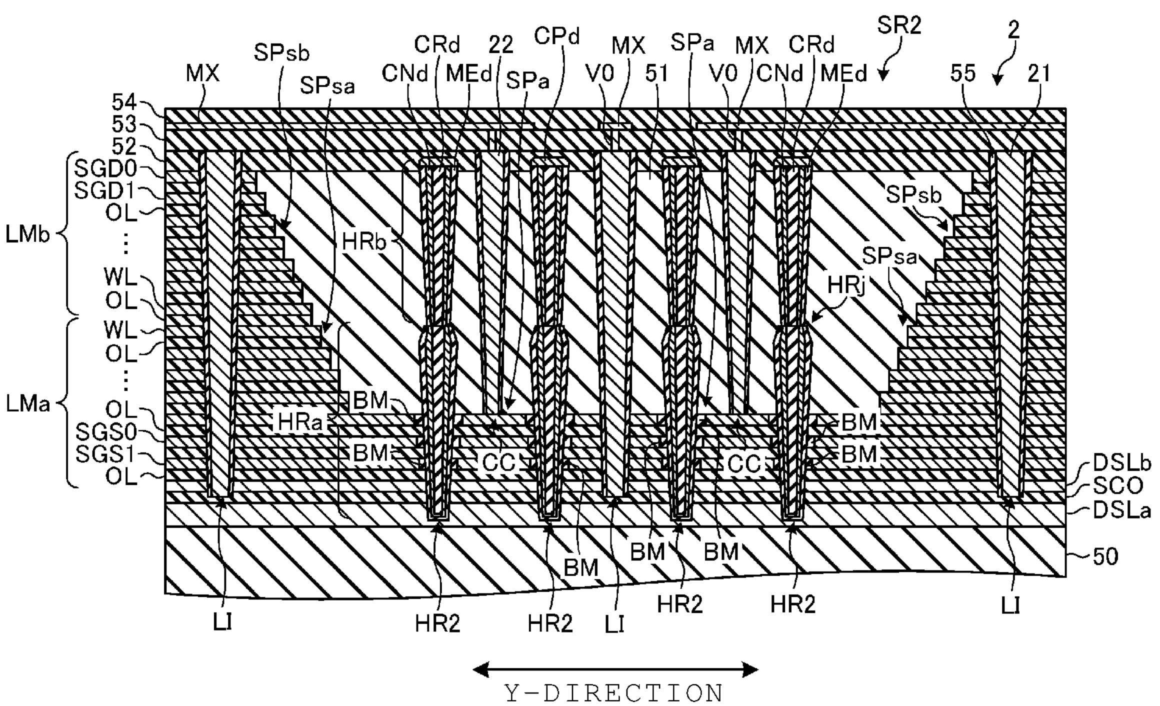

In an embodiment described above, the insulating layers NL and OL are alternately stacked to form the stacked body LMs. However, the stacked body LMs may be formed in a plurality of tiers, and in that case, the pillar PL, the columnar portion HR, the staircase portion SP, and the like may be formed stepwise each time one tier of the stacked body LMs is formed. With this configuration, the number of stacked layers of the word line WL can be further increased. FIGS. 16A and 16B illustrate examples of a semiconductor memory device 2 provided with 2-tier of stacked bodies LMa and LMb.

FIGS. 16A and 16B are cross-sectional views along the Y-direction including the staircase region SR2 of the semiconductor memory device 2 according to other modifications of the embodiment. In FIGS. 16A and 16B, the same configurations as those of the semiconductor memory device 1 of the embodiment described above are designated by the same reference numerals and the description thereof will be omitted.

As illustrated in FIGS. 16A and 16B, the semiconductor memory device 2 includes the stacked bodies LMa and LMb.

The stacked body LMa includes select gate lines SGS0 and SGS1 on a side of the source line SL, and has a configuration in which a plurality of word lines WL and a plurality of insulating layers OL are alternately stacked. The stacked body LMb has a configuration in which the plurality of word lines WL and the plurality of insulating layers OL are alternately stacked on the stacked body LMa, and includes select gate lines SGD0 and SGD1 on the upper layer of these word lines WL.

Further, the stacked body LMa includes a staircase portion SPa in which a plurality of word lines WL and select gate lines SGS0 and SGS1 in the stacked body LMa are processed in the staircase shape. Dummy staircase portions SPsa are disposed on both sides of the staircase portion SPa in the Y-direction, respectively. Further, the stacked body LMa includes a dummy staircase portion (not illustrated) corresponding to the staircase portion SPf of the embodiment described above, and facing the staircase portion SPa in the X-direction.

On the other hand, the stacked body LMb includes a staircase portion SPb processed in the staircase shape so that the plurality of word lines WL and select gate lines SGD0 and SGD1 in the stacked body LMb continuously ascend from the staircase portion SPa. Dummy staircase portions SPsb continuously continued from the staircase portion SPsa are respectively disposed on both sides of the staircase portion SPb in the Y-direction. Further, the stacked body LMb includes a dummy staircase portion (not illustrated) corresponding to the staircase portion SPf of the embodiment described above, and facing the staircase portion SPb in the X-direction.

A staircase region SR2 of the semiconductor memory device 2 includes these staircase portions SPa, SPb, SPsa, SPsb, and the like.

Further, in the staircase region SR2 of the semiconductor memory device 2, a plurality of columnar portions HR2 that penetrate the insulating layer 51 that covers the staircase region SR2, the staircase portions SPa, SPb, the upper source line DSLb, the intermediate insulating layer SCO, and the like, and reach the lower source line DSLa are disposed.

The columnar portion HR2 is provided with a columnar portion HRa disposed in the same layer as the stacked body LMa, and a columnar portion HRb disposed in the same layer as the stacked body LMb.

The columnar portion HRa extends downward from the height position of the upper surface of the stacked body LMa and reaches the lower source line DSLa. The columnar portion HRb is provided with, for example, a dummy layer CPd disposed in the insulating layer 52 at the upper end, extends downward from the height position of the upper surface of the stacked body LMb, and reaches the height position of the upper surface of the stacked body LMa. A lower end portion of the columnar portion HRb is connected to an upper end portion of the corresponding columnar portion HRa by a connection portion HRj.

Further, each of the columnar portions HRa and HRb has a shape such as a circular shape, an elliptical shape, or an oval shape as a cross-sectional shape in the direction along the XY-plane. Further, each of the columnar portions HRa and HRb has a tapered shape in which the diameter and the cross-sectional area decrease from the upper end portion to the lower end portion, for example. Alternatively, each of the columnar portions HRa and HRb has a bowing shape having a maximum diameter and cross-sectional area at an intermediate position between the upper end portion and the lower end portion.

The columnar portion HR2 includes a dummy layer CRd that penetrates the insulating layer 51, the staircase portions SPa and SPb, the upper source line DSLb, the intermediate insulating layer SCO, and the like and extends to the lower source line DSLa, a dummy layer CNd that covers the side surface and the bottom surface of the dummy layer CRd, and a dummy layer MEd that has a multilayer structure such as an oxide layer/nitride layer/oxide layer and covers the side surface and the bottom surface of the dummy layer CNd.

That is, these dummy layers CRd, CNd, and MEd continuously extend in the stacking direction from the vicinity of the upper end portion of the columnar portion HRb to the vicinity of the lower end portion of the columnar portion HRa. Further, these dummy layers CRd, CNd, and MEd have a step in the connection portion HRj between the columnar portion HRb and the columnar portion HRa, for example. This is because when the columnar portions HRa and HRb have a tapered shape or a bowing shape, respectively, the diameter of the columnar portion HR2 once reduced at the lower end portion of the columnar portion HRb expands again at the upper end portion of the columnar portion HRa.

The semiconductor memory devices 2 illustrated in FIGS. 16A and 16B are manufactured, for example, as follows.

The stacked body LMa including a sacrificial layer instead of the word line WL or the like is formed on the source line SL. Further, a lower layer structure such as staircase portions SPa and SPsa of the staircase region SR2 is formed on the stacked body LMa. Further, a hole that later becomes the columnar portion HRa and a memory hole that later becomes a lower structure of the pillar are formed in the stacked body LMa, and the hole and the memory hole are filled with the sacrificial layer.

A stacked body LMb including the sacrificial layer instead of the word line WL or the like is formed on the stacked body LMa. Further, an upper layer structure such as staircase portions SPb and SPsb of the staircase region SR2 is formed on the stacked body LMb. Further, a hole that later becomes a columnar portion HRb and a memory hole that later becomes an upper structure of the pillar are formed in the stacked body LMb and connected to the hole and the memory hole in the stacked body LMa, respectively.

The sacrificial layer is removed from the hole and memory hole of the stacked body LMa through the hole and memory hole of the stacked body LMb to form the hole and memory hole straddling the stacked bodies LMa and LMb. By forming the dummy layer MEd and the memory layer ME, the dummy layer CNd and the channel layer CN, and the dummy layer CRd and the core layer CR over the entire length of the hole and the memory hole straddling the stacked body LMa and LMb in order, the columnar portion HR2 and the pillar extending over the entire stacking direction of the LMa and LMb are formed.

A slit penetrating the stacked bodies LMa and LMb is formed, and the intermediate sacrificial layer in the source line SL and the sacrificial layer in the stacked bodies LMa and LMb are replaced to form the intermediate source line, the word line WL, and the like, respectively.

After that, the plate-shaped contact LI, the contact CC, the penetration contact C4, and the like obtain the semiconductor memory device 2.

Here, also in the semiconductor memory device 2 including the two-tier of the stacked bodies LMa and LMb, as described above, the dummy layer corresponding to the block insulating layer on the outermost periphery of the dummy layer MEd (dummy layer BKd of the embodiment described above), the flanged portion BM, and the insulating layers OL of the stacked bodies LMa and LMb may not be clear to each other. Even in such a case, by paying attention to the points described in FIG. 4 of the embodiment described above, it can be distinguished that the columnar portion HR2 includes the flanged portion BM.

That is, one of the fact that the dummy layer corresponding to the block insulating layer and the flanged portion BM have a void at the height position of the word line WL or the like of the insulating layer (insulating layer 45 in FIG. 4 described above) mixed with the insulating layer OL or the like, the fact that the outer diameter of the insulating layer in the columnar portion HR2 extending in the staircase portions SPa and SPb is larger than the outer diameter of the insulating layer in the columnar portion HR2 extending in the source line SL directly under the staircase portions SPa and SPb, and, the fact that the outer diameter of the insulating layer in the columnar portion HR2 extending in the staircase portions SPa and SPb is larger than the outer diameter of the insulating layer in the columnar portion HR2 extending in the insulating layer 51 directly above the staircase portions SPa and SPb can be evidence that the columnar portion HR2 includes the flanged portion BM.

However, there are some points to keep in mind when comparing the outer diameter of the insulating layer in the columnar portion HR2 extending in the staircase portions SPa and SPb with the outer diameter of the insulating layer in the columnar portion HR2 extending in the insulating layer 51 directly above the staircase portions SPa and SPb.

FIG. 16A illustrates a cross section of a part where the word line WL of the uppermost layer of the stacked body LMa becomes a terrace surface. As illustrated in FIG. 16A, in this case, the connection portion HRj of the columnar portion HR2 is positioned at the boundary part between the staircase portion SPa and the insulating layer 51.

When the columnar portions HRa and HRb have a tapered shape or a bowing shape, respectively, the outer shape itself of the columnar portion HR2 except for the flanged portion BM changes significantly in the connection portion HRj. Therefore, in order to distinguish that the columnar portion HR2 has the flanged portion BM, in the cross section of FIG. 16A, it may not be appropriate to compare the outer diameter of the insulating layer in the columnar portion HR2 extending in the staircase portion SPa with the outer diameter of the insulating layer in the columnar portion HR2 extending in the insulating layer 51 directly above the staircase portion SPa.

That is, in order to distinguish that the columnar portion HR2 includes the flanged portion BM, it is preferable to compare the outer shapes of the columnar portions HR2 in a part where the word line WL or the select gate line SGD on the upper layer than the word line WL of the uppermost layer of the stacked body LMa of a lower tier of the 2-tier becomes the terrace surface. Alternatively, it is preferable to compare the outer shapes of the columnar portions HR2 in a part where the word line WL or the select gate line SGS on the lower layer than the word line WL of the uppermost layer of the stacked body LMa of the lower tier of the 2-tier becomes the terrace surface.

FIG. 16B illustrates a cross section of a part where a word line WL other than the uppermost layer in the stacked body LMa becomes the terrace surface. That is, the word line WL forming the terrace surface in FIG. 16B is on a lower layer than the word line WL forming the terrace surface depicted in the cross section of FIG. 16A. As illustrated in FIG. 16B, the connection portion HRj of the columnar portion HR2 is positioned above the boundary part between the staircase portion SPa and the insulating layer 51.

When comparing the outer diameters of the insulating layer in the columnar portion HR2 in the cross section of FIG. 16B, it can be seen that, due to the flanged portion BM of the columnar portion HR2 on a side wall, the outer diameter of the insulating layer in the columnar portion HR2 extending in the staircase portion SPa is larger than the outer diameter of the insulating layer in the columnar portion HR2 extending in the insulating layer 51 directly above the staircase portion SPa. Therefore, it is distinguished that the columnar portion HR2 includes the flanged portion BM.

As described above, by comparing the outer diameters of the columnar portion HR2 in the upper layer or the lower layer of the cross section of FIG. 16A, more accurate analysis becomes possible and the existence of the flanged portion BM can be checked.

Furthermore, in embodiments and modifications, the staircase portions SP, SPa, SPb and the like are interposed between the memory region MRs and disposed in the central portion of the stacked body LM. However, a configuration in which the contact CC are disposed on the staircase portions on one side or both sides of the stacked body LM in the X-direction so as to have a function of drawing out the word line WL or the like may be adopted. Also in such a case, the configurations of the columnar portions HR, HR2, and the like of embodiments and modifications described above can be applied.

In an embodiment and modification, the pillar PL is connected to the source line SL on the side surface of the channel layer CN, but examples are not limited thereto. For example, the pillar may be configured to be connected to the source line at the lower end portion of the channel layer by removing the memory layer on the bottom surface of the pillar.

In an embodiment and modification, the peripheral circuit CUA is disposed below the stacked body LM. However, in some examples, the peripheral circuit may be disposed above the stacked body or in the same layer as the stacked body.

When the peripheral circuit is disposed above the stacked body, a peripheral circuit may be formed on a semiconductor substrate different from the substrate on which the stacked body is formed and the semiconductor substrate on which the peripheral circuit is formed may be bonded to the upper surface of the stacked body. With this configuration, the stacked body could be formed on a substrate that is not a semiconductor substrate. For example, a polysilicon layer or the like can be formed as a source line on a non-semiconductor substrate, and then a stacked body can be formed on the source line. Furthermore, in this case, the semiconductor memory device may not have to include the penetration contact region.

When the peripheral circuit is disposed in the same layer as the stacked body, the stacked body can be formed at a position different from the peripheral circuit on the semiconductor substrate on which the peripheral circuit is formed. In this configuration, impurities can be diffused on the surface layer of the semiconductor substrate, a part of the semiconductor substrate can be used as a source line, and then the stacked body can be formed on the semiconductor substrate. Furthermore, in this case, the semiconductor memory device may not have to include the penetration contact region.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:

a stacked body with a plurality of first conductive layers and a plurality of first insulating layers alternately stacked, the stacked body having a connection region in which a plurality of contacts are connected to the plurality of first conductive layers;

a pillar that extends in a stacking direction through the stacked body in a region away from the connection region in a first direction intersecting the stacking direction, memory cells being at intersections of the pillar with at least some of the plurality of first conductive layers; and a columnar portion that extends in the stacking direction through the stacked body at the connection region, wherein the columnar portion includes:

a first semiconductor layer extending in the stacking direction, a second insulating layer covering a side wall of the first semiconductor layer, and a third insulating layer covering a side wall of the second insulating layer, the third insulating layer comprising a material different from that of the second insulating layer and including a plurality of flanged portions on a sidewall thereof, the flanged portions protruding toward a side of the plurality of first conductive layers at height positions corresponding to the plurality of first conductive layers.

2. The semiconductor memory device according to claim 1, wherein at least one flanged portion of the plurality of flanged portions contains a void inside.

3. The semiconductor memory device according to claim 1, wherein the third insulating layer has an insulating layer part that covers the side wall of the second insulating layer and extends along the stacking direction, and when viewed from the stacking direction, a center position of each of the plurality of flanged portions at the height positions corresponding to the plurality of first conductive layers is substantially coincident with a center position of the insulating layer part at respective height positions of each of the plurality of flanged portions.

4. The semiconductor memory device according to claim 1, wherein the third insulating layer includes an insulating layer part that covers the side wall of the second insulating layer and extends along the stacking direction, and when viewed from the stacking direction, a cross-sectional shape of each of the plurality of flanged portions at the height positions corresponding to the plurality of first conductive layers is substantially similar to a cross-sectional shape of the insulating layer part at respective height positions of each of the plurality of flanged portions.

5. The semiconductor memory device according to claim 1, wherein the pillar includes:

a second semiconductor layer extending in the stacking direction, a fourth insulating layer comprising the same material as the second insulating layer and covering a side wall of the second semiconductor layer, and a fifth insulating layer comprising the same material as the third insulating layer and covering a side wall of the fourth insulating layer.

6. The semiconductor memory device according to claim 5, wherein the second and fourth insulating layers are nitride layers, and the third and fifth insulating layers are oxide layers.

7. A semiconductor memory device, comprising:

a stacked body with a plurality of first conductive layers and a plurality of first insulating layers alternately stacked, the stacked body having a staircase portion in which the plurality of first conductive layers are in a staircase shape;

an upper insulating layer covering the staircase portion;

a pillar that extends in a stacking direction through the stacked body in a region away from the staircase portion in a first direction intersecting the stacking direction, memory cells being at intersections of the pillar with at least some of the plurality of first conductive layers; and a columnar portion that extends in the stacking direction through the upper insulating layer and the stacked body at the staircase portion, wherein the columnar portion includes:

a first semiconductor layer extending in the stacking direction through the upper insulating layer and the stacked body, a second insulating layer covering a side wall of the first semiconductor layer, and a third insulating layer covering a side wall of the second insulating layer, the third insulating layer comprising a material different from that of the second insulating layer, and an outer edge of the third insulating layer at a first height position corresponding to a position along the stacking direction of an uppermost one of the plurality of first conductive layers in the staircase portion of the stacked body is at a position that is outside a region that is surrounded by a virtual line formed when the outer edge of the third insulating layer at a second height position corresponding to a position along the stacking direction of a lower surface of the upper insulating layer that is above the uppermost one of the plurality of first conductive layers is projected downward to the first height position from the second height position.

8. The semiconductor memory device according to claim 7, wherein there is no step in the second insulating layer at a boundary between the upper insulating layer and the stacked body, and the second insulating layer extends in the stacking direction in the staircase portion of the stacked body and in the upper insulating layer.

9. The semiconductor memory device according to claim 7, wherein the third insulating layer covers the side wall of the second insulating layer and extends in the stacking direction, and when viewed from the stacking direction, the third insulating layer at third height positions of each of the plurality of first conductive layers widens substantially concentrically from an outer edge of the second insulating layer at the third height positions.

10. The semiconductor memory device according to claim 7, wherein, when viewed from the stacking direction, the uppermost one of the plurality of first conductive layers surrounds the columnar portion at a substantially equal distance from a center of the columnar portion.

11. The semiconductor memory device according to claim 7, wherein the third insulating layer contains a void at a height position of at least one first conductive layer in the plurality of first conductive layers.

12. The semiconductor memory device according to claim 7, wherein the pillar includes:

a second semiconductor layer extending in the stacking direction, a fourth insulating layer comprising the same material as the second insulating layer and covering a side wall of the second semiconductor layer, and a fifth insulating layer comprising the same material as the third insulating layer and covering a side wall of the fourth insulating layer.

13. The semiconductor memory device according to claim 12, wherein the second and fourth insulating layers are nitride layers, and the third and fifth insulating layers are oxide layers.

14. A semiconductor memory device, comprising:

a stacked body with a plurality of first conductive layers and a plurality of first insulating layers alternately stacked, the stacked body having a staircase portion in which the plurality of first conductive layers are in a staircase shape;

a second conductive layer that is below the stacked body;

a pillar that extends in a stacking direction through the stacked body in a region away from the staircase portion in a first direction intersecting the stacking direction, memory cells being at intersections of the pillar with at least some of the plurality of first conductive layers; and a columnar portion that extends in the stacking direction through the stacked body at the staircase portion and reaches the second conductive layer, wherein the columnar portion includes:

a first semiconductor layer extending in the stacking direction, a second insulating layer covering a side wall of the first semiconductor layer, and a third insulating layer covering a side wall of the second insulating layer, the third insulating layer comprising a material different from that of the second insulating layer, and an outer edge of the third insulating layer at a first height position corresponding to a position along the stacking direction of a lowermost one of the plurality of first conductive layers in the staircase portion of the stacked body is at a position that is outside a region that is surrounded by a virtual line formed when the outer edge of the third insulating layer at a second height position corresponding to a position along the stacking direction of an upper surface of the second conductive layer is projected upward to the first height position from the second height position.

15. The semiconductor memory device according to claim 14, wherein the second insulating layer extends in the stacking direction and reaches to a position below the second height position without a step change at a boundary between the stacked body and the second conductive layer.

16. The semiconductor memory device according to claim 14, wherein, when viewed from the stacking direction, the third insulating layer at third height positions of each of the plurality of first conductive layers widens substantially concentrically from an outer edge of the second insulating layer at the third height positions.

17. The semiconductor memory device according to claim 14, wherein, when viewed from the stacking direction, the lowermost one of the plurality of first conductive layers surrounds the columnar portion at a substantially equal distance from a center of the columnar portion.

18. The semiconductor memory device according to claim 14, wherein the third insulating layer contains a void at a height position of at least one first conductive layer in the plurality of first conductive layers.

19. The semiconductor memory device according to claim 14, wherein the pillar includes:

a second semiconductor layer extending in the stacking direction, a fourth insulating layer comprising the same material as the second insulating layer and covering a side wall of the second semiconductor layer, and a fifth insulating layer comprising the same material as the third insulating layer and covering a side wall of the fourth insulating layer.

20. The semiconductor memory device according to claim 19, wherein the second and fourth insulating layers are nitride layers, and the third and fifth insulating layers are oxide layers.

* * * * *